US009941255B2

(12) United States Patent
Nakashima et al.

(10) Patent No.: US 9,941,255 B2
(45) Date of Patent: Apr. 10, 2018

(54) POWER SEMICONDUCTOR MODULE

(71) Applicant: MITSUBISHI ELECTRIC CORPORATION, Chiyoda-ku (JP)

(72) Inventors: Junichi Nakashima, Chiyoda-ku (JP); Yoshiko Tamada, Chiyoda-ku (JP); Yasushi Nakayama, Chiyoda-ku (JP); Yukimasa Hayashida, Fukuoka (JP)

(73) Assignee: MITSUBISHI ELECTRIC CORPORATION, Chiyoda-ku (JP)

( * ) Notice: Subject to any disclaimer, the term of this patent is extended or adjusted under 35 U.S.C. 154(b) by 0 days.

(21) Appl. No.: 15/117,963

(22) PCT Filed: Jun. 30, 2014

(86) PCT No.: PCT/JP2014/003465
§ 371 (c)(1),
(2) Date: Aug. 10, 2016

(87) PCT Pub. No.: WO2015/121900
PCT Pub. Date: Aug. 20, 2015

(65) Prior Publication Data
US 2016/0358895 A1     Dec. 8, 2016

(30) Foreign Application Priority Data
Feb. 11, 2014   (JP) .................................. 2014-023923

(51) Int. Cl.
*H02M 1/00*      (2006.01)
*H01L 25/07*     (2006.01)
(Continued)

(52) U.S. Cl.
CPC .......... *H01L 25/072* (2013.01); *H01L 23/049* (2013.01); *H01L 23/24* (2013.01);
(Continued)

(58) Field of Classification Search
CPC .. H02M 7/003; H01R 13/6675; H01R 13/665
(Continued)

(56) References Cited

U.S. PATENT DOCUMENTS

| 5,202,578 A | 4/1993 | Hideshima |
| 2007/0051974 A1 | 3/2007 | Azuma et al. |

(Continued)

FOREIGN PATENT DOCUMENTS

| JP | 3-97257 A | 4/1991 |
| JP | 7-231071 A | 8/1995 |

(Continued)

OTHER PUBLICATIONS

Japanese Office Action dated Sep. 5, 2017 in Japanese Patent Application No. 2015-562569 (with English translation).

(Continued)

*Primary Examiner* — Alex Torres-Rivera
(74) *Attorney, Agent, or Firm* — Oblon, McClelland, Maier & Neustadt, L.L.P.

(57) ABSTRACT

A power semiconductor module includes: a positive arm and a negative arm that are formed by series connection of self-arc-extinguishing type semiconductor elements and that are connected at a connection point between the self-arc-extinguishing type semiconductor elements; a positive-side DC electrode, a negative-side DC electrode, and an AC electrode that are connected to the positive arm and the negative arm; and a substrate on which a wiring pattern is formed, the wiring pattern connecting the self-arc-extinguishing type semiconductor elements of the positive arm and the negative arm to the positive-side DC electrode, the negative-side DC electrode and the AC electrode. The positive-side DC electrode, the negative-side DC electrode, (Continued)

and the AC electrode are insulated from one another and arranged such that one of the electrodes faces each of the other two electrodes.

17 Claims, 20 Drawing Sheets

(51) Int. Cl.
*H01L 23/48* (2006.01)
*H01L 25/18* (2006.01)
*H01L 23/24* (2006.01)
*H01L 23/373* (2006.01)
*H01L 23/498* (2006.01)
*H01L 23/049* (2006.01)
*H01L 23/31* (2006.01)
*H01L 29/16* (2006.01)
*H01L 29/20* (2006.01)
*H01L 29/41* (2006.01)
*H01L 29/861* (2006.01)

(52) U.S. Cl.
CPC ...... *H01L 23/3114* (2013.01); *H01L 23/3735* (2013.01); *H01L 23/48* (2013.01); *H01L 23/49811* (2013.01); *H01L 25/07* (2013.01); *H01L 25/18* (2013.01); *H01L 29/1602* (2013.01); *H01L 29/1608* (2013.01); *H01L 29/2003* (2013.01); *H01L 29/41* (2013.01); *H01L 29/861* (2013.01); *H01L 2224/0603* (2013.01); *H01L 2224/32225* (2013.01); *H01L 2224/48111* (2013.01); *H01L 2224/48139* (2013.01); *H01L 2224/48227* (2013.01); *H01L 2224/49113* (2013.01); *H01L 2224/49175* (2013.01); *H01L 2224/49433* (2013.01); *H01L 2224/73265* (2013.01)

(58) Field of Classification Search
USPC .................................................. 363/146, 147
See application file for complete search history.

(56) References Cited

U.S. PATENT DOCUMENTS

| | | | | |
|---|---|---|---|---|
| 2008/0291710 | A1* | 11/2008 | Aoki | H01L 23/473 363/131 |
| 2010/0148298 | A1 | 6/2010 | Takano et al. | |
| 2011/0101515 | A1 | 5/2011 | Beaupre et al. | |
| 2012/0188712 | A1* | 7/2012 | Ishibashi | H02M 7/003 361/688 |
| 2014/0361424 | A1* | 12/2014 | Horio | H02M 7/003 257/704 |
| 2014/0367736 | A1* | 12/2014 | Iizuka | H01L 25/072 257/133 |
| 2015/0131232 | A1* | 5/2015 | Ishino | H01L 23/4334 361/707 |
| 2015/0382501 | A1* | 12/2015 | Horiuchi | H05K 7/20927 363/131 |

FOREIGN PATENT DOCUMENTS

| | | |
|---|---|---|
| JP | 3692906 B2 | 7/2005 |
| JP | 2007-42796 A | 2/2007 |
| JP | 2007-59737 A | 3/2007 |
| JP | 2008-98308 A | 4/2008 |
| JP | 2009-105454 A | 5/2009 |
| JP | 2010-35369 A | 2/2010 |
| JP | 2010-118699 A | 5/2010 |
| JP | 2011-97053 A | 5/2011 |
| WO | 2007/142038 A1 | 12/2007 |
| WO | 2013/128787 A1 | 9/2013 |

OTHER PUBLICATIONS

International Search Report dated Sep. 30, 2014 in PCT/JP2014/003465 filed Jun. 30, 2014.

* cited by examiner (a)

(b)

(a)

(b)

(c)

(a)

(b)

(a)

(b)

(c)

US 9,941,255 B2

POWER SEMICONDUCTOR MODULE

TECHNICAL FIELD

The present invention relates to a structure for reducing an inductance in a power semiconductor module.

BACKGROUND ART

In an insulated-type power semiconductor module used for a power conversion device such as an inverter, a wiring pattern is formed on a metal plate serving as a heat-radiation plate with an insulating substrate interposed therebetween. On this wiring pattern, a power semiconductor element is provided and connected to an electrode terminal with a wire bond or the like. This power semiconductor element is sealed with resin.

In the power semiconductor module performing a switching operation at a large current and a high voltage, a surge voltage $\Delta V = L \cdot di/dt$ is applied to the power semiconductor element according to a time change rate di/dt of the current achieved when the power semiconductor element is turned off and according to a parasitic inductance L included in the power conversion device. When the parasitic inductance is relatively large, a surge voltage exceeding a breakdown voltage of the power semiconductor element is generated, which may lead to breakage of the power semiconductor element. Accordingly, the power conversion device needs to be reduced in inductance and the power semiconductor module also needs to be reduced in inductance.

The power semiconductor module having a positive arm and a negative arm provided in its package includes elements exhibiting a relatively large inductance. These elements may be a positive electrode, a negative electrode, and an output (alternating-current (AC)) electrode that are connected to an external circuit.

Thus, in recent years, electrodes provided within a module are stacked, so that the magnetic flux is cancelled between the electrodes when a current flows therethrough, thereby implementing inductance reduction (for example, PTD 1).

CITATION LIST

Patent Document

PTD 1: Japanese Patent No. 3692906 (page 4, FIG. 1)

SUMMARY OF INVENTION

Technical Problem

However, the conventional power semiconductor module is configured such that a P power line as a positive electrode, an N power line as a negative electrode and an output line U as an output electrode are stacked in the order of P-U-N. In this case, the direction of the magnetic flux generated by the current flowing through output line U is opposite to the direction of the magnetic flux generated by the current flowing through one of the P power line and the N power line in the direction opposite to that of the current flowing through output line U. Accordingly, these magnetic fluxes are cancelled out and thereby decreased, so that the inductance is reduced. The magnetic flux is canceled effectively between P-U and between U-N, so that the inductance can be reduced. However, the output line U existing between P-N leads to a problem that the effect of cancelling a magnetic flux is decreased, thereby decreasing the effect of reducing an inductance.

The present invention has been made to solve the above-described problems. An object of the present invention is to provide a power semiconductor module in which breakage of a power semiconductor element by a surge voltage can be suppressed by reducing an inductance between all of the wiring lines.

Solution to Problem

A power semiconductor module according to the present invention includes: a positive arm and a negative arm that are formed by series connection of self-arc-extinguishing type semiconductor elements, the positive arm and the negative arm being connected at a series connection point between the self-arc-extinguishing type semiconductor elements; a positive-side electrode, a negative-side electrode, and an AC electrode that are connected to the positive arm and the negative arm; and a substrate on which a wiring pattern is formed, the wiring pattern connecting the self-arc-extinguishing type semiconductor elements of the positive arm and the negative arm to the positive-side electrode, the negative-side electrode and the AC electrode. The positive-side electrode, the negative-side electrode, and the AC electrode are insulated from one another, and arranged such that one of the positive-side electrode, the negative-side electrode and the AC electrode faces each of other two of the positive-side electrode, the negative-side electrode and the AC electrode.

Advantageous Effects of Invention

According to the present invention, the positive-side electrode, the negative-side electrode, and the AC electrode are arranged such that one of these electrodes faces each of the other two electrodes. Accordingly, the direction of di/dt is reversed and the magnetic flux is cancelled between the positive-side electrode and the AC electrode facing each other, between the AC electrode and the negative-side electrode facing each other, and between the positive-side electrode and the negative-side electrode facing each other. Consequently, the inductance can be reduced between the electrodes facing each other.

DESCRIPTION OF EMBODIMENTS

First Embodiment

Figure 1:
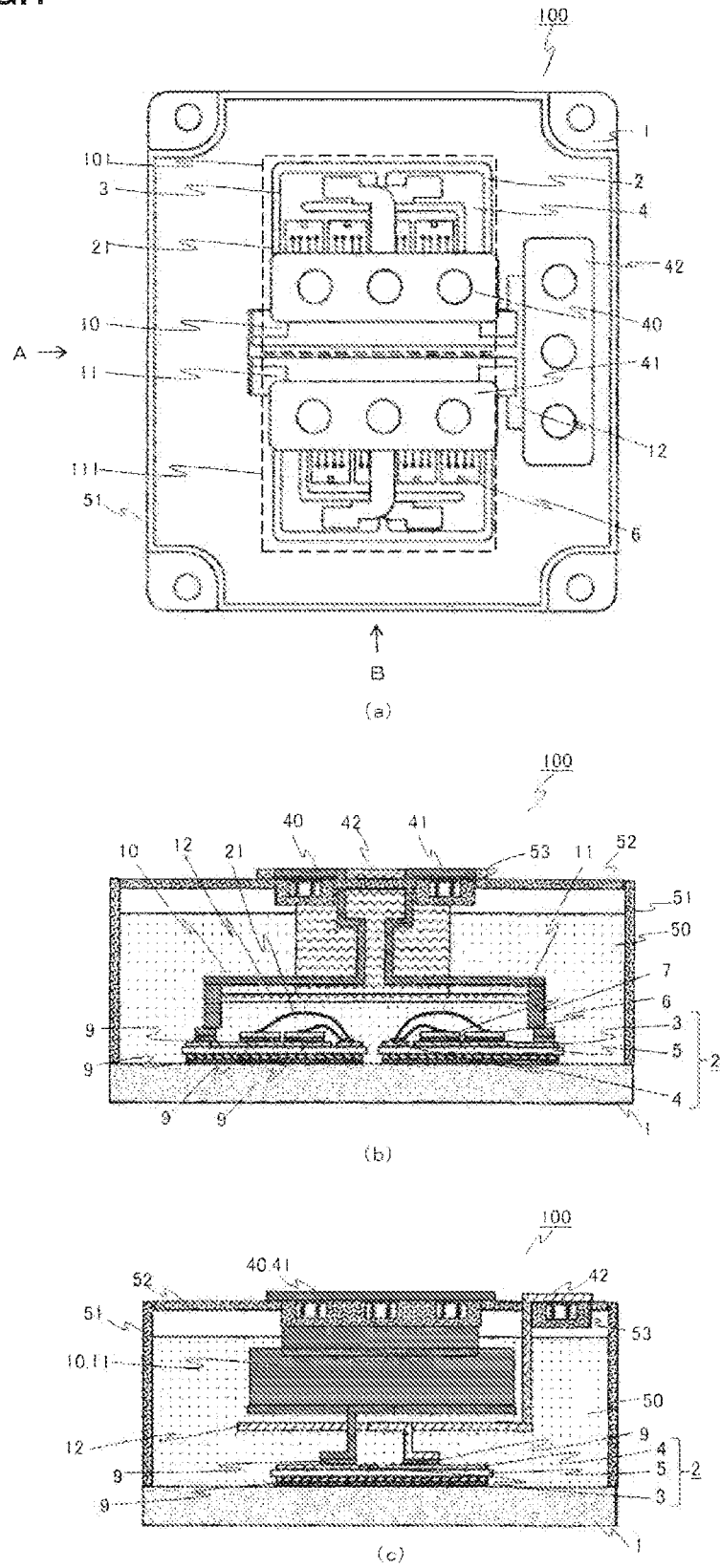
FIG. 1 is a schematic top plan view and a schematic side view of a power semiconductor module according to the first embodiment of the present invention.
Figure 2:
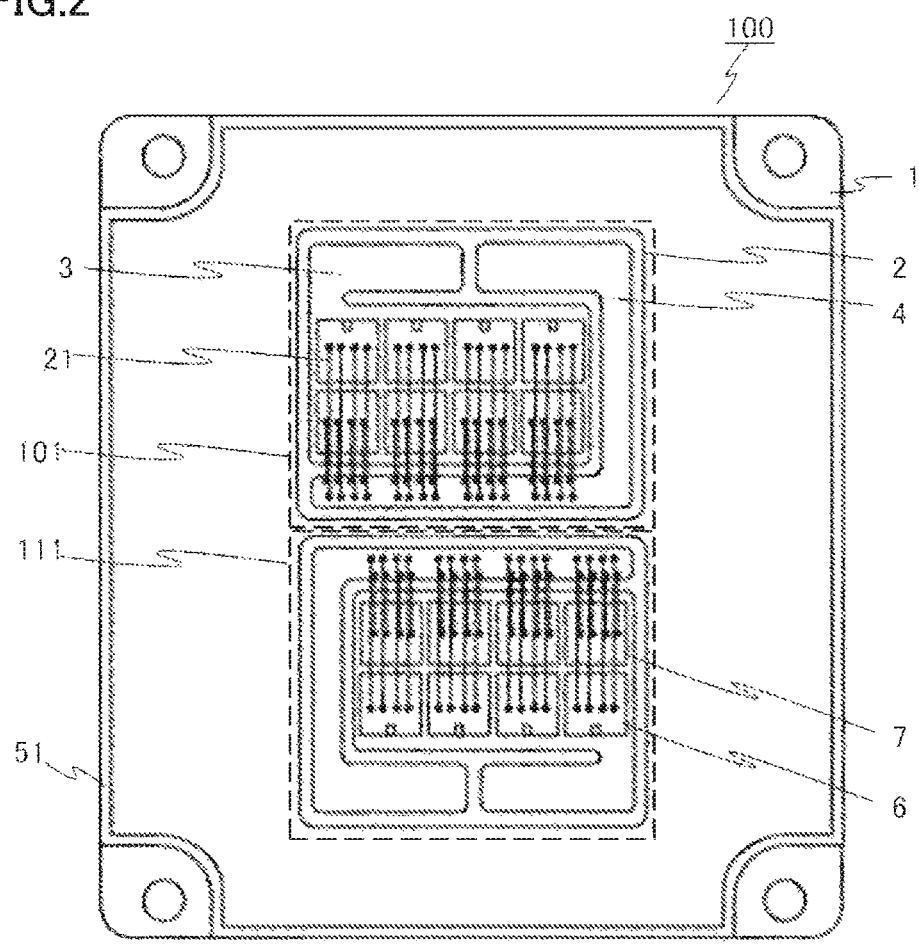
FIG. 2 is a top plan view of the power semiconductor module according to the first embodiment of the present invention, from which an electrode is removed.
Figure 3:
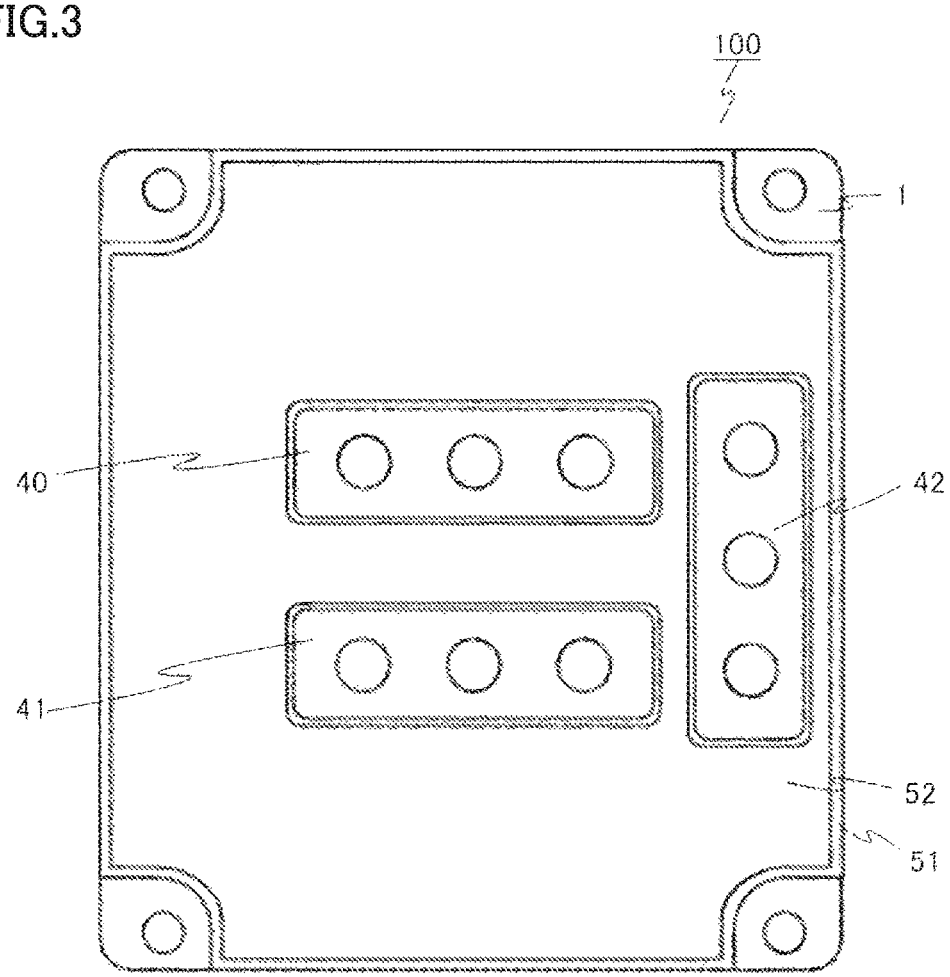
FIG. 3 is a top external view of the power semiconductor module according to e first embodiment of the present invention.

FIG. 1 is a schematic top plan view and a schematic side view of a power semiconductor module according to the first embodiment of the present invention. FIG. 1(a) shows a schematic top plan view of a power semiconductor module 100. FIG. 1(b) shows a schematic side view as seen from the B side in FIG. 1(a). FIG. 1(c) shows a schematic side view as seen from the A side in FIG. 1(a). FIG. 2 is a top plan view of the power semiconductor module according to the first embodiment of the present invention, from which an electrode is removed. FIG. 3 is a top external view of the power semiconductor module according to the first embodiment of the present invention. In this case, the direction seen from the B side is defined as a B direction, and the direction seen from the A side is defined as an A direction.

In FIGS. 1 to 3, power semiconductor module 100 according to the present first embodiment includes a base plate 1, a collector (drain) wiring pattern 3, an emitter (source) wiring pattern 4, a ceramic insulating substrate 5, a self-arc-extinguishing type semiconductor element 6, a reflux diode 7, a solder 9, a positive electrode 10 serving as a positive-side electrode, a negative electrode 11 serving as a negative-side electrode, an AC electrode 12, a bonding wire 21, a positive electrode terminal 40 serving as a terminal portion of positive electrode 10, a negative electrode terminal 41 serving as a terminal portion of negative electrode 11, an AC terminal 42 serving as a terminal portion of AC electrode 12, a sealing material 50, a case 51, a cover 52, and a nut 53.

In power semiconductor module 100 according to the present first embodiment, ceramic insulating substrate 5 is bonded with solder 9 on one surface of base plate 1 serving as a metal heat radiator that radiates heat generated from self-arc-extinguishing type semiconductor element 6 and reflux diode 7 that form power semiconductor module 100. This ceramic insulating substrate 5 is made of an insulation material to which metal foil is bonded by brazing or the like. On the other hand, wiring patterns 3 and 4 are bonded with metal foil by brazing or the like on the surface of ceramic insulating substrate 5 that is opposite to the surface thereof bonded to base plate 1. Insulating substrate 2 is formed by wiring patterns 3 and 4 and ceramic insulating substrate 5 to which metal foil is bonded. It is to be noted that the material of the insulating substrate is not limited to ceramic, but may be a metal substrate made of a resin insulating material.

Self-arc-extinguishing type semiconductor element 6 and reflux diode 7 are bonded with solder 9 on the surfaces of collector (drain) wiring pattern 3 and emitter (source) wiring pattern 4 that are opposite to the surfaces thereof to which ceramic insulating substrate 5 is bonded. Furthermore, positive electrode 10, negative electrode 11, and AC electrode 12 are bonded to each of collector (drain) wiring pattern 3 and emitter (source) wiring pattern 4. Although solder 9 is used as a bonding material, other joining methods may be used without limitation to solder 9.

Since a large current flows through positive electrode 10, negative electrode 11 and AC electrode 12, a screw is generally used for connecting these electrodes to an external circuit. However, without limitation to a screw, other bonding methods may be employed as long as a large current is allow to flow. In the first embodiment, positive electrode 10, negative electrode 11, and AC electrode 12 include, on their module upper surfaces, positive electrode terminal 40, negative electrode terminal 41, and AC terminal 42, respectively, used for connecting these electrodes to an external circuit.

Also, each of positive electrode terminal 40, negative electrode terminal 41, and AC terminal 42 is provided with a hole through which a screw is inserted. A case having a nut embedded therein is placed under these terminals. Furthermore, power semiconductor module 100 is surrounded by case 51. Sealing material 50 is introduced into case 51 for providing insulation in the inside of case 51. Then, a cover 52 is fitted on case 51, and bonded by an adhesive or the like.

The surfaces of self-arc-extinguishing type semiconductor element 6 and reflux diode 7 that are not solder-bonded to emitter (source) wiring pattern 4 are bonded to a wiring pattern and the like by bonding wire 21.

Figure 4:
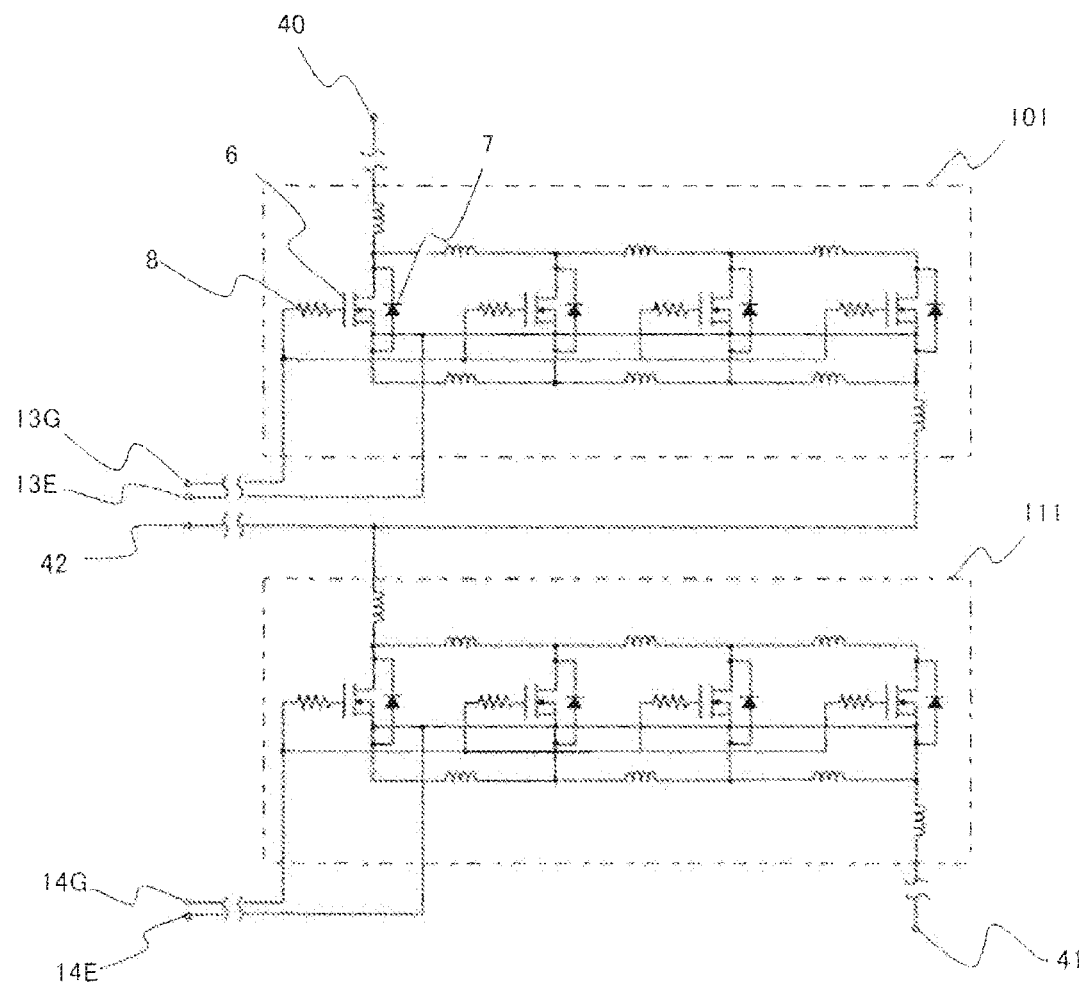
FIG. 4 is an equivalent circuit diagram of the power semiconductor module according to the first embodiment of the present invention.

Here, an equivalent circuit of power semiconductor module 100 according to the first embodiment is shown in FIG. 4. Although self-arc-extinguishing type semiconductor element 6 is shown as a MOSFET (Metal-Oxide-Semiconductor Field-Effect Transistor), the effect of the present invention can still be achieved even in the case of other self-arc-extinguishing type semiconductor elements such as an IGBT (Insulated Gate Bipolar Transistor) and a bipolar transistor. Also, the effect of the present invention can still be achieved not only by a semiconductor element made of Si (Silicon) as a raw material but also by a semiconductor element made of SiC (Silicon Carbide), GaN (Gallium nitride), or a diamond as a raw material. More remarkable effects can be achieved particularly when SiC, GaN or the like that allows a high-speed operation is used.

Power semiconductor module 100 is a module including a positive arm and a negative arm for a power conversion circuit within the same case (the same package), which is commonly referred to as "2-in-1". Each arm is configured as a circuit in which self-arc-extinguishing type semiconductor element 6 and reflux diode 7 are connected in anti-parallel. Furthermore, in the case where self-arc-extinguishing type semiconductor element 6 has a diode incorporated therein, reflux diode 7 does not necessarily have to be separately provided, but each arm can be formed only by a self-arc-extinguishing type semiconductor element having a diode incorporated therein. Insulating substrate 101 forms a positive arm while insulating substrate 111 forms a negative arm. The series connection point between the self-arc-extinguishing type semiconductor elements is a portion at which the positive arm and the negative arm are connected.

One insulating substrate 2 forms each arm in power semiconductor module 100 in FIG. 1. However, the number of self-arc-extinguishing type semiconductor elements 6 and the number of reflux diodes 7 are different depending on the current capacity of the power semiconductor module. Accordingly, if a large number of chips are arranged on one insulating substrate, the insulating substrate is increased in size. In this case, there occurs a reliability problem that, for example, cracking occurs in insulating substrate 2 due to a difference of the thermal expansion coefficient between this insulating substrate 2 and components such as base plate 1 and solder 9 in the power semiconductor module. Therefore, it is preferable to consider that insulating substrate 2 is divided (into a plurality of substrates) depending on the current capacity, for example, in the case where a large number of elements are provided.

In insulating substrate 101 arranged in the positive arm, positive electrode 10 is connected to collector (drain) wiring pattern 3 while AC electrode 12 is connected to emitter (source) wiring pattern 4. Furthermore, in insulating substrate 111 arranged in the negative arm, AC electrode 12 is connected to collector (drain) wiring pattern 3 while negative electrode 11 is connected to emitter (source) wiring pattern 4.

AC electrode 12 includes a parallel surface provided as a parallel surface portion and a vertical surface provided as a vertical surface portion relative to the surface of insulating substrate 2 on which wiring patterns 3 and 4 are formed. The parallel surface is arranged at a position where the insulation distance between this parallel surface and insulating substrate 2 in each of the positive and negative arms is ensured. Furthermore, positive electrode 10 includes a parallel surface provided as a parallel surface portion and a vertical surface provided as a vertical surface portion relative to the surface of insulating substrate 2 on which wiring patterns 3 and 4 are formed, in which the parallel surface is arranged to be parallel to the upper portion of the parallel surface in the AC electrode in the state where this parallel surface is insulated from the AC electrode. Furthermore, negative electrode 11 includes a parallel surface provided as a parallel surface portion and a vertical surface provided as a vertical surface portion relative to the surface of insulating substrate 2 on which wiring patterns 3 and 4 are formed, in which the parallel surface is arranged to be parallel to the upper portion of the parallel surface in the AC electrode in the state where this parallel surface is insulated from the AC electrode. The vertical surface of the positive electrode and the vertical surface of the negative electrode, which are insulated from each other, are arranged to face each other and to be parallel to each other.

In the following description, the parallel surface means a portion of the electrode that is parallel to the surface of insulating substrate 2 on which wiring patterns 3 and 4 are formed; and the vertical surface means a portion of the electrode that is perpendicular to the surface of insulating substrate 2 on which wiring patterns 3 and 4 are formed.

Then, a 2-level circuit formed using 2-in-1 type power semiconductor module 100 will be hereinafter described. FIG. 4 is an equivalent circuit diagram of the power semiconductor module according to the first embodiment of the present invention. In FIG. 4, power semiconductor module 100 includes a self-arc-extinguishing type semiconductor element 6, a reflux diode 7, a gate resistance 8, a positive electrode terminal 40, a negative electrode terminal 41, an AC terminal 42, a positive arm-side insulating substrate 101, and a negative arm-side insulating substrate 111. Each of positive arm-side insulating substrate 101 and negative arm-side insulating substrate 111 includes a plurality of self-arc-extinguishing type semiconductor elements 6, a plurality of reflux diodes 7, and a plurality of gate resistances 8. FIG. 4 shows self-arc-extinguishing type semiconductor element 6 as a MOSFET by way of example, and the subsequent figures each also show self-arc-extinguishing type semiconductor element 6 as a MOSFET.

It is to be noted that FIG. 4 shows an equivalent circuit including a gate control circuit of self-arc-extinguishing type semiconductor element 6, in which a positive electrode-side gate 13G, a positive electrode-side control source 13E, a negative electrode-side gate 14G, and a negative electrode-side control source 14E are shown as terminals. In FIGS. 1 to 3 each showing the inner structure of the module, however, only the structure related to the circuit in a main circuit is shown, but the structure related to the control circuit is omitted and shown in a simplified manner. It actually includes a mechanism in which: a wiring pattern for controlling self-arc-extinguishing type semiconductor element 6 is formed on insulating substrate 2; and the gate or the control source electrode on self-arc-extinguishing type semiconductor element 6 and the gate or the control source electrode for connection to the outside are electrically connected to each other, and exposed from the upper surface or the like of the power semiconductor module so as to be able to be connected to an outer conductor. Such configurations are the same as those in other embodiments, and do not exert an influence upon the effect of the present invention. However, the wiring pattern on the control circuit tends to be subjected to induction by a main circuit current in self-arc-extinguishing type semiconductor element 6, that is, a current flowing through wiring patterns 3 and 4. Accordingly, in order to suppress current unbalance, it is desirable that each wiring pattern on the control circuit is formed such that the gate and the control source are arranged in parallel.

Figure 5:
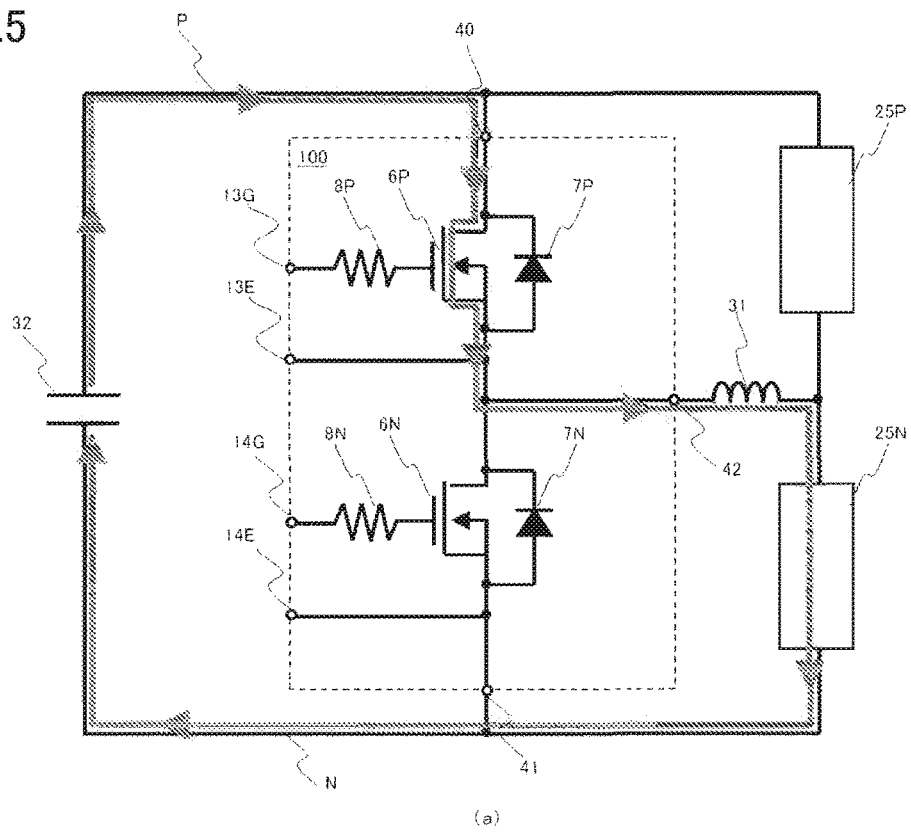
FIG. 5 is a switching operation circuit diagram of a positive arm-side self-arc-extinguishing type semiconductor element in a 2-level circuit of the power semiconductor module according to the first embodiment of the present invention.
Figure 5:
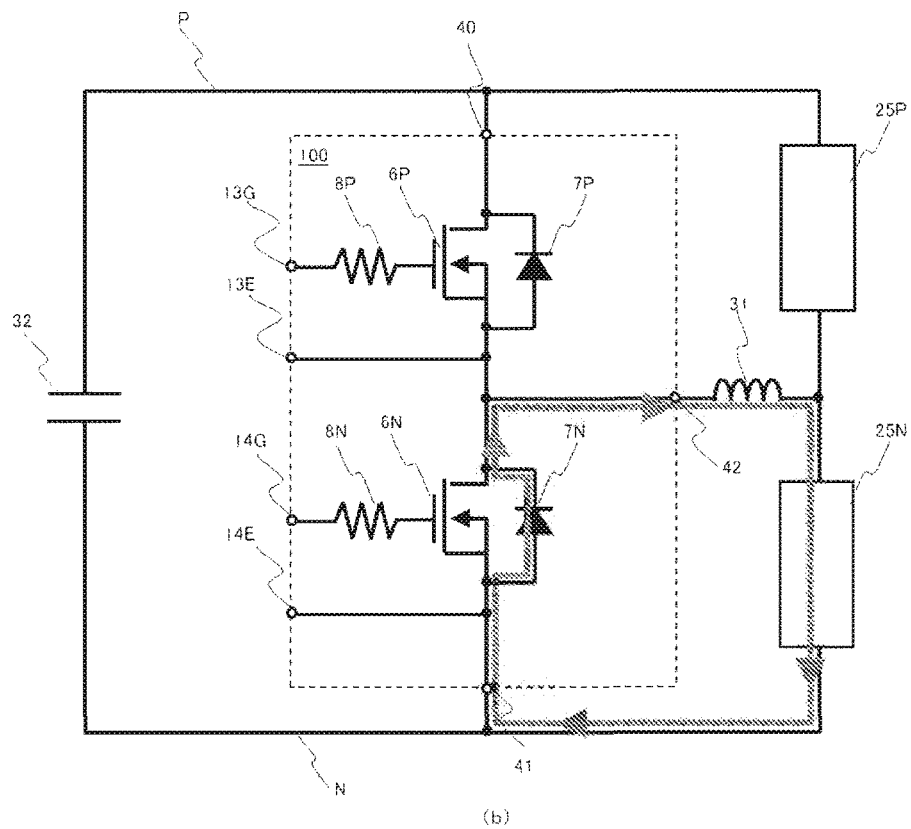
Figure 6:
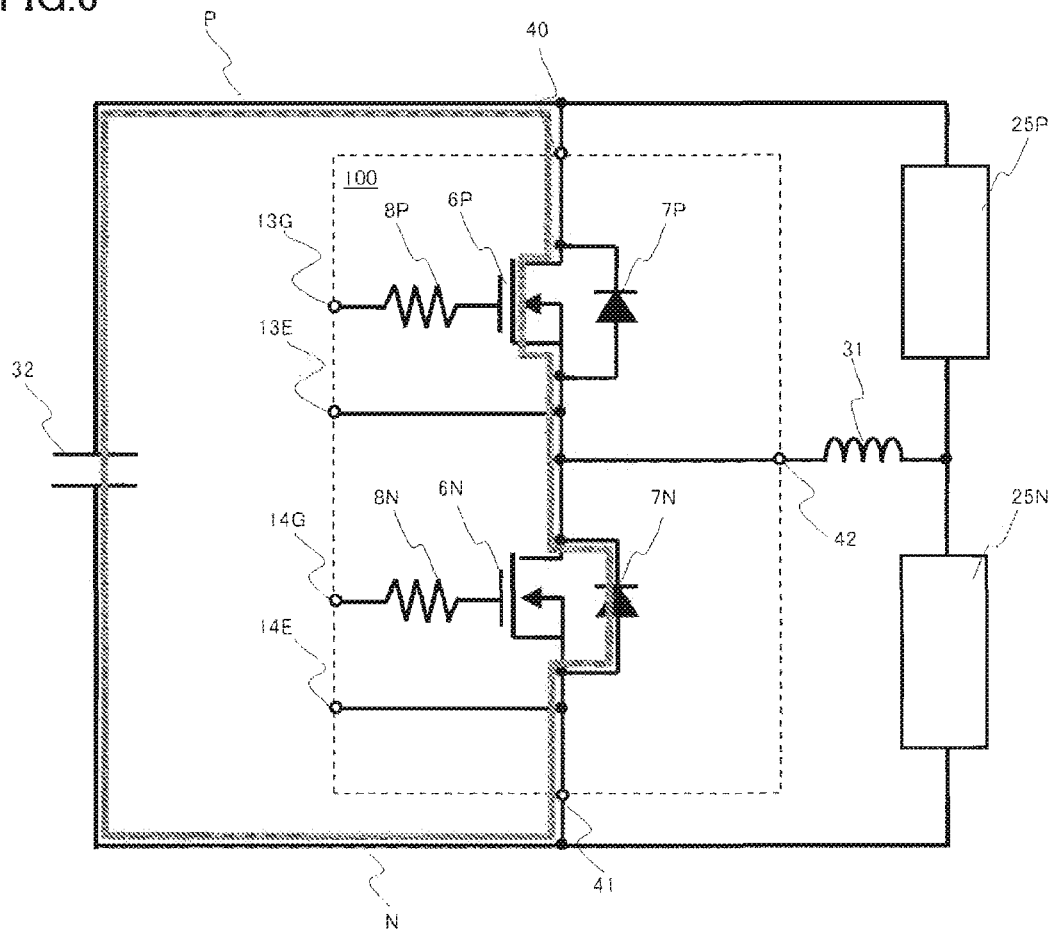
FIG. 6 is a circuit diagram showing a commutation loop during the switching operation of the positive arm-side self-arc-extinguishing type semiconductor element in the power semiconductor module according to the first embodiment of the present invention.

FIG. 5 is a switching operation circuit diagram of a positive arm-side self-arc-extinguishing type semiconductor element in a 2-level circuit of the power semiconductor module according to the first embodiment of the present invention. FIG. 6 is a circuit diagram showing a commutation loop during the switching operation of the positive arm-side self-arc-extinguishing type semiconductor element in the power semiconductor module according to the first embodiment of the present invention. Referring to the operation circuit diagrams shown in FIGS. 5(a), 5(b) and 6, the mode in which the positive arm-side MOSFET is switched will be hereinafter described, for example, by exemplifying the case where self-arc-extinguishing type semiconductor element 6 is provided as a MOSFET. Also in FIGS. 5 and 6, a plurality of self-arc-extinguishing type semiconductor elements 6, a plurality of reflux diodes 7 and a plurality of gate resistances 8 in each arm are collectively shown.

As shown in FIG. 5(a), both ends of capacitor 32 are connected between a positive-side direct-current (DC) bus P and a negative-side DC bus N, in which positive electrode terminal 40 of power semiconductor module 100 is connected to positive-side DC bus P, and negative electrode terminal 41 of power semiconductor module 100 is connected to negative-side DC bus N, thereby forming a 2-level circuit. The portion surrounded by a dotted line in FIG. 5(a) shows power semiconductor module 100, and open circles show positive electrode terminal 40, negative electrode terminal 41 and AC terminal 42 that are exposed from the surface of power semiconductor module 100. Also in FIG. 5, each arrow overlaid on the circuit shows a current path in the case where a positive arm-side MOSFET 6P is switched.

In FIG. 5(a), when positive arm-side MOSFET 6P is turned on, a current flows from the positive electrode of capacitor 32 through positive arm-side MOSFET 6P and AC terminal 42, and passes through a load 31 such as a motor, and then flows through a negative arm 25N in other phase into the negative electrode of capacitor 32. In FIGS. 5 and 6, load 31 is represented as an inductance. Also in each of the subsequent figures, load 31 is represented as an inductance. On the other hand, when positive arm-side MOSFET 6P is switched from ON to OFF, as shown in FIG. 5(b), the current flowing through load 31 flows back to a negative arm-side reflux diode 7N. In this case, the commutation loop occurring at the time when positive arm-side MOSFET 6P is turned off is formed as a loop extending from the positive electrode of capacitor 32 through positive arm-side MOSFET 6P and negative arm-side reflux diode 7N back to the negative electrode of capacitor 32, as shown in FIG. 6. FIGS. 5(a), 5(b) and 6 each show only the MOSFET, the reflux diode and the capacitor. However, the circuit actually includes an inductance and a resistance component of a wiring line that connects semiconductor elements to each other, and its commutation loop includes its wiring inductance and resistance component.

On the other hand, the commutation loop occurring when negative arm-side MOSFET 6N is switched is formed as a loop extending from the positive electrode of capacitor 32 through positive arm-side reflux diode 7P and negative arm-side MOSFET 6N back to the negative electrode of capacitor 32. It can be said that the loops are almost identical between the case where positive arm-side MOSFET 6P is switched and the case where negative arm-side MOSFET 6N is switched in the sense that each loop passes through positive electrode terminal 40 and negative electrode terminal 41 of power semiconductor module 100. The surge voltage to be applied when self-arc-extinguishing type semiconductor element 6 is turned off is proportional to the inductance in the commutation loop. Accordingly, the inductance in the commutation loop shown in FIG. 6 needs to be reduced in the 2-level circuit. The factor of the inductance in the commutation loop is categorized into three factors including: an inductance of the bus bar connecting the capacitor to the power semiconductor module; an inductance of the capacitor itself; and an inductance within the power semiconductor module. The present invention relates to the third factor associated with reduction of a wiring inductance within the power semiconductor module.

Figure 7:
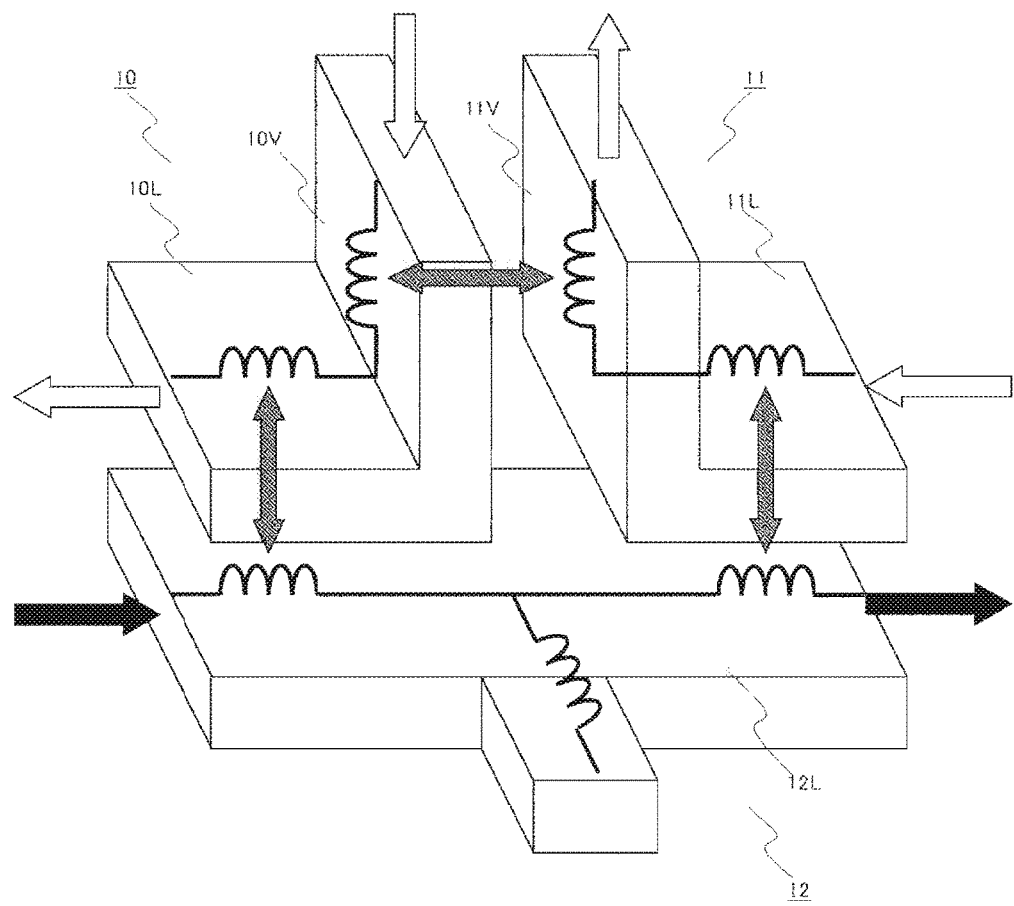
FIG. 7 is a schematic diagram showing the state of cancellation of a magnetic flux between electrodes facing each other during occurrence of the commutation loop shown in FIG. 6.

FIG. 7 is a schematic diagram showing the state of cancellation of a magnetic flux between electrodes facing each other during occurrence of the commutation loop shown in FIG. 6. In FIG. 7, positive electrode 10 includes a parallel surface 10L provided as a parallel surface portion, and a vertical surface 10V provided as a vertical surface portion; negative electrode 11 includes a parallel surface 11L provided as a parallel surface portion, and a vertical surface 11V provided as a vertical surface portion; and AC electrode 12 includes a parallel surface 12L provided as a parallel surface portion. Also, each arrow schematically shows the direction in which a current flows, and each wiring line part is represented as an inductance. Furthermore, each double-headed arrow explicitly shows a portion of each wiring line part where magnetic flux cancellation occurs. The current path during occurrence of the commutation loop mentioned above will be described as follows.

FIG. 7 shows a part of the commutation loop shown in FIG. 6 that is located within the power semiconductor module, which is specifically as follows: positive electrode terminal 40 (not shown)→vertical surface 10V of positive electrode 10→parallel surface 10L of positive electrode 10→positive arm-side insulating substrate 101→parallel surface 12L of AC electrode 12→negative arm-side insulating substrate 111→parallel surface 11L of negative electrode 11→vertical surface 11V of negative electrode 11→negative electrode terminal 41 (not shown). In this process, the direction of di/dt is reversed and the magnetic flux is cancelled: (i) between vertical surface 10V of positive electrode 10 and vertical surface 11V of negative electrode 11 that are arranged to face each other; (ii) between parallel surface 10L of positive electrode 10 and parallel surface 12L of AC electrode 12 that are arranged to face each other; and (iii) between parallel surface 11L of negative electrode 11 and parallel surface 12L of AC electrode 12 that are arranged to face each other. Consequently, the inductance can be reduced.

In the power semiconductor module configured as described above, positive electrode 10, negative electrode 11, and AC electrode 12 are arranged such that one of these electrodes faces each of the other two electrodes. Accordingly, it becomes possible to cancel the magnetic flux generated between the electrodes at the time when a current flows through each electrode. Consequently, the inductance caused by each of positive electrode 10, negative electrode 11 and AC electrode 12 is reduced, and the surge voltage applied to the semiconductor element is reduced, so that the reliability of the power semiconductor module can be improved.

Second Embodiment

In the second embodiment, a circuit is formed using a plurality of insulating substrates, which is different from the first embodiment in which a circuit is formed using a single insulating substrate. Also in the circuit formed using a plurality of insulating substrates in this way, positive electrode 10, negative electrode 11, and AC electrode 12 are arranged such that one electrode faces each of the other two electrodes, so that the inductance can be reduced.

Figure 8:
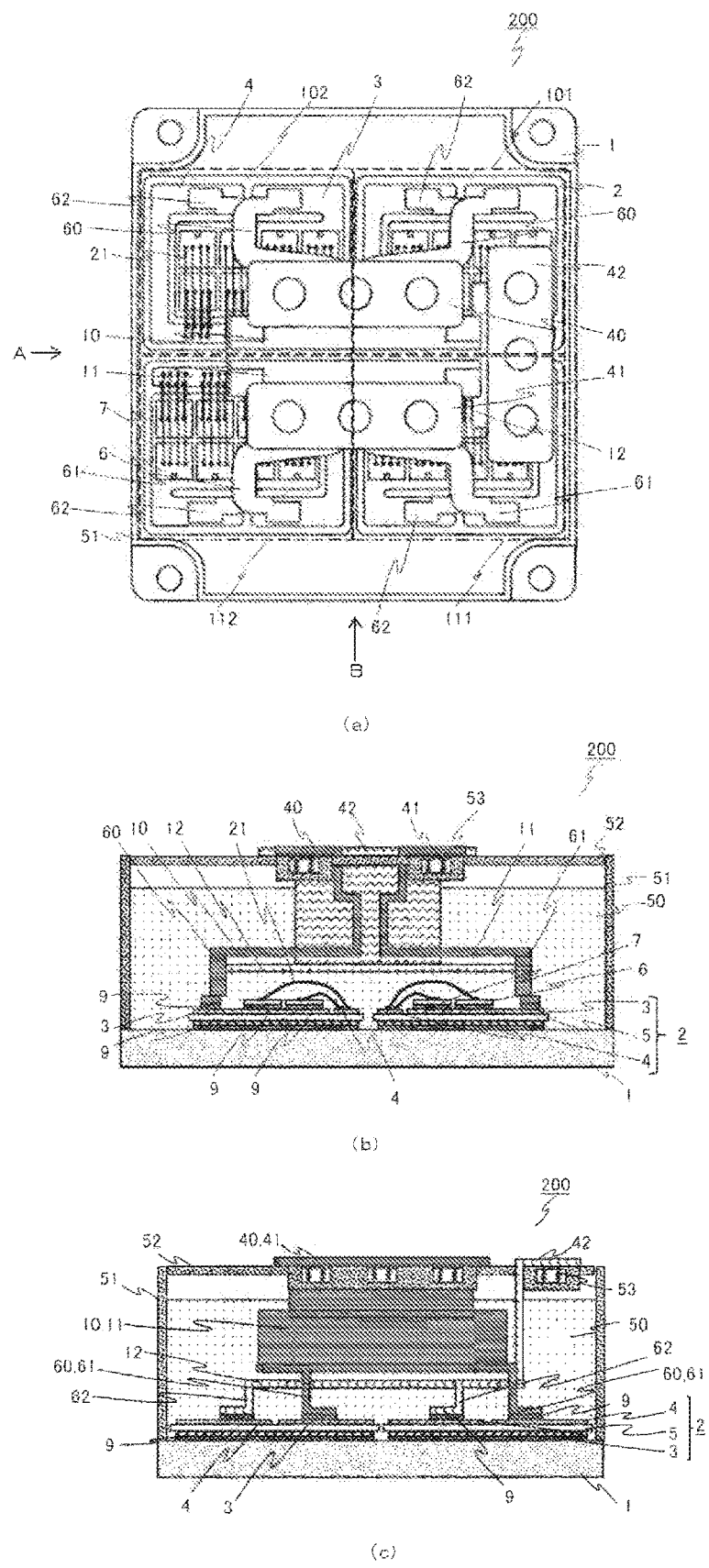
FIG. 8 is a schematic top plan view and a schematic side view of a power semiconductor module according to the second embodiment of the present invention.
Figure 9:
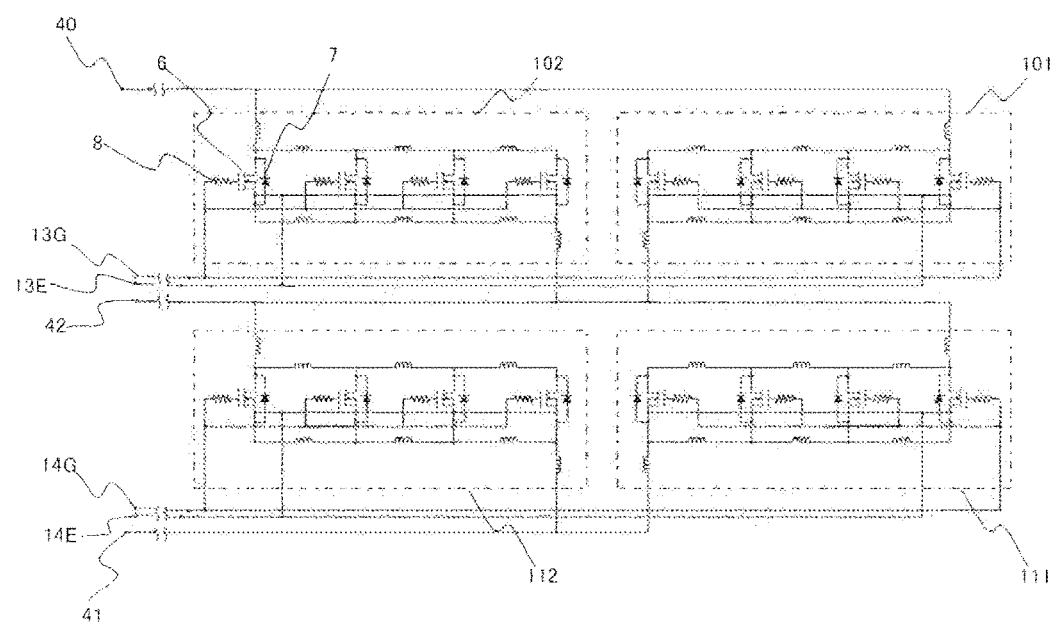
FIG. 9 is an equivalent circuit diagram of the power semiconductor module in the case where two insulating substrates are provided as a positive arm and a negative arm in the power semiconductor module according to the second embodiment of the present invention.

FIG. 8 is a schematic top plan view and a schematic side view of a power semiconductor module according to the second embodiment of the present invention. FIG. 8(*a*) shows a top plan view of power semiconductor module 200. FIG. 8(*b*) shows a schematic side view as seen from the B side in FIG. 8(*a*) while FIG. 8(*c*) shows a schematic side view as seen from the A side in FIG. 8(*a*). FIG. 9 is an equivalent circuit diagram of the power semiconductor module in the case where a plurality of insulating substrates are provided as a positive arm and a negative arm in the second embodiment of the present invention. In this figure, the direction as seen from the B side is defined as a B direction while the direction as seen from the A side is defined as an A direction.

In FIG. 8, power semiconductor module 200 according to the present second embodiment includes a base plate 1, an insulating substrate 2, a collector (drain) wiring pattern 3, an emitter (source) wiring pattern 4, a self-arc-extinguishing type semiconductor element 6, a reflux diode 7, a solder 9, a positive electrode 10 serving as a positive-side electrode, a negative electrode 11 serving as a negative-side electrode, an AC electrode 12, a bonding wire 21, a positive electrode terminal 40 serving as a terminal portion in positive electrode 10, a negative electrode terminal 41 serving as a terminal portion in negative electrode 11, an AC terminal 42 serving as a terminal portion in AC electrode 12, a positive branch electrode 60 serving as a branch electrode portion in positive electrode 10, a negative branch electrode 61 serving as a branch electrode portion in negative electrode 11, an AC branch electrode 62 serving as a branch electrode portion in AC electrode 12, a sealing material 50, a case 51, a cover 52, and a nut 53.

As shown in FIG. 8, positive electrode 10, negative electrode 11 and AC electrode 12 are arranged to extend across a plurality of insulating substrates 2 in order to connect the plurality of insulating substrates 2. Each of positive electrode 10 and negative electrode 11 has a parallel surface formed in an approximately rectangular shape having a longer side extending in the direction in which a plurality of insulating substrates 2 are arranged in parallel (A direction). Furthermore, AC electrode 12 has a parallel surface formed in an approximately rectangular shape having: (i) a shorter side extending in the direction in which this shorter side extends between the positive arm and the negative arm so as to connect the positive arm and the negative arm in series (B direction); and (ii) a longer side extending in the direction in which a plurality of insulating substrates 2 are connected in parallel (A direction). Furthermore, each electrode is branched from the parallel surface of each electrode toward wiring patterns 3 and 4 and connected to insulating substrates 101, 102, 111, and 112. In such branched portions, the branch electrode of positive electrode 10 is defined as a positive branch electrode 60; the branch electrode of negative electrode 11 is defined as a negative branch electrode 61; and the branch electrode of AC electrode 12 is defined as an AC branch electrode 62.

Positive branch electrode 60 and AC branch electrode 62 are insulated from each other and arranged in parallel. Also, portions of positive branch electrode 60 and AC branch electrode 62 that are arranged in parallel are identical in shape. Furthermore, negative branch electrode 61 and AC branch electrode 62 are insulated from each other and arranged in parallel. Also, portions of negative branch electrode 61 and AC branch electrode 62 that are arranged in parallel are identical in shape.

Also in the case where a plurality of insulating substrates 2 are employed, the inductance can be reduced as in the case where a single insulating substrate 2 is provided for each of a positive arm and a negative arm.

Then, the switching operation in a 2-level circuit formed using a 2-in-1 type power semiconductor module 200 will be hereinafter described. By way of example, the following is an explanation about the mode in which the positive arm-side MOSFET performs a switching operation. FIG. 9 is an equivalent circuit diagram of the power semiconductor module in the case where two insulating substrates are provided as a positive arm and a negative arm in the power semiconductor module according to the second embodiment of the present invention. The second embodiment is different from the first embodiment in that power semiconductor module 100 in the first embodiment is replaced with power semiconductor module 200. In FIG. 9, power semiconductor module 200 includes a self-arc-extinguishing type semiconductor element 6, a reflux diode 7, a gate resistance 8, a positive electrode 10, a negative electrode 11, an output electrode 12, positive arm-side insulating substrates 101, 102, and negative arm-side insulating substrates 111, 112. Each of positive arm-side insulating substrates 101, 102 and negative arm-side insulating substrates 111, 112 includes a plurality of self-arc-extinguishing type semiconductor elements 6, a plurality of reflux diodes 7, and a plurality of gate resistances 8.

FIG. 9 shows an equivalent circuit including a gate control circuit of self-arc-extinguishing type semiconductor element 6, in which a positive electrode-side gate 13G, a positive electrode-side control source 13E, a negative electrode-side gate 14G, and a negative electrode-side control source 14E are shown as terminals. In FIG. 8 showing the inner structure of the module, however, only the structure related to the circuit in a main circuit is shown, but the structure related to the control circuit is omitted and shown in a simplified manner. It actually includes a mechanism in which: a wiring pattern for controlling self-arc-extinguishing type semiconductor element 6 is formed on insulating substrate 2; and the gate or the control source electrode on self-arc-extinguishing type semiconductor element 6 and the gate or the control source electrode for connection to the outside are electrically connected to each other, and exposed from the upper surface or the like of the power semiconductor module so as to be able to be connected to an outer conductor. Such configurations are the same as those in other embodiments, and do not exert an influence upon the effect of the present invention. However, the wiring pattern on the control circuit tends to be subjected to induction by a main circuit current in self-arc-extinguishing type semiconductor element 6, that is, a current flowing through wiring patterns 3 and 4. Accordingly, in order to suppress current unbalance, it is desirable that the wiring pattern on the control circuit is formed such that the gate and the control source are arranged in parallel.

Figure 10:
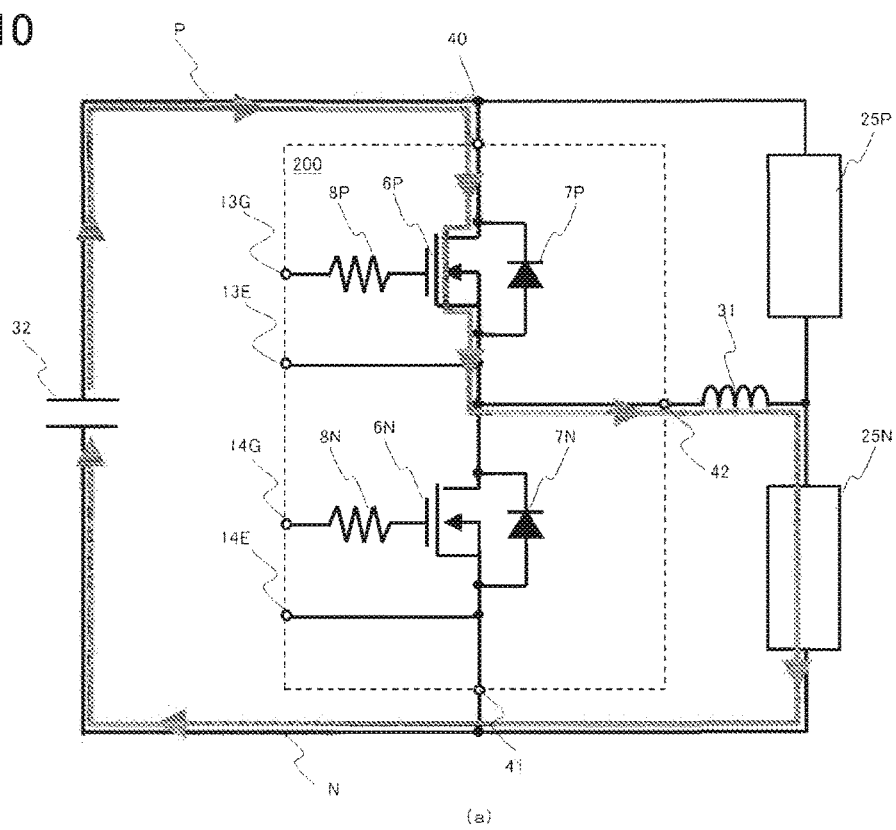
FIG. 10 is a switching operation circuit diagram of a positive arm-side self-arc-extinguishing type semiconductor element in a 2-level circuit according to the second embodiment of the present invention.
Figure 10:
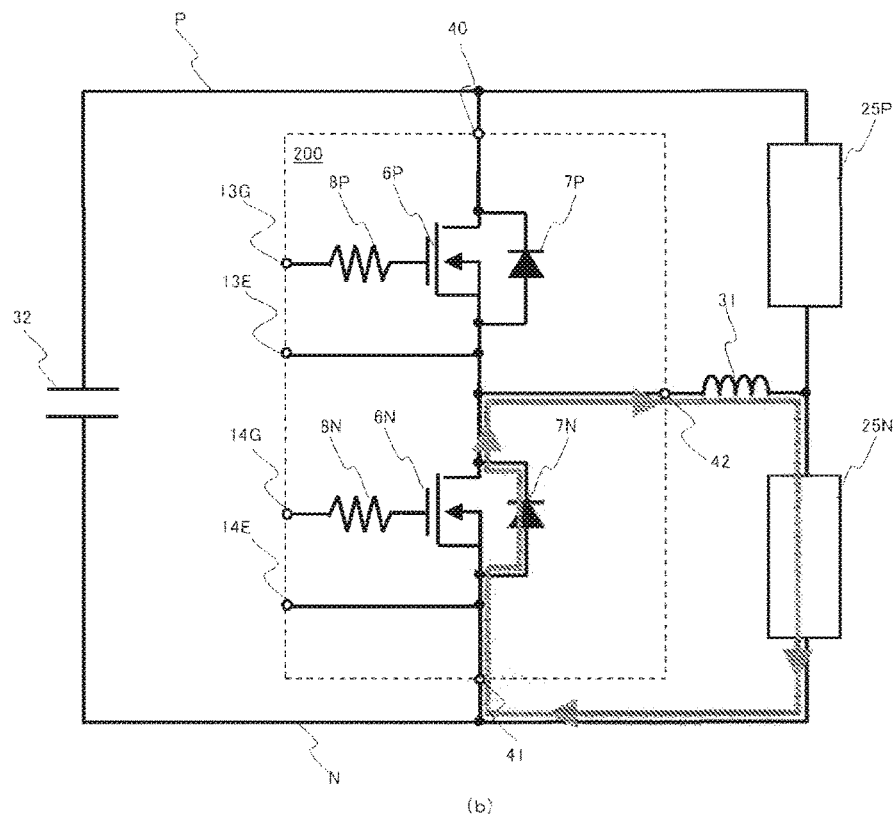
Figure 11:
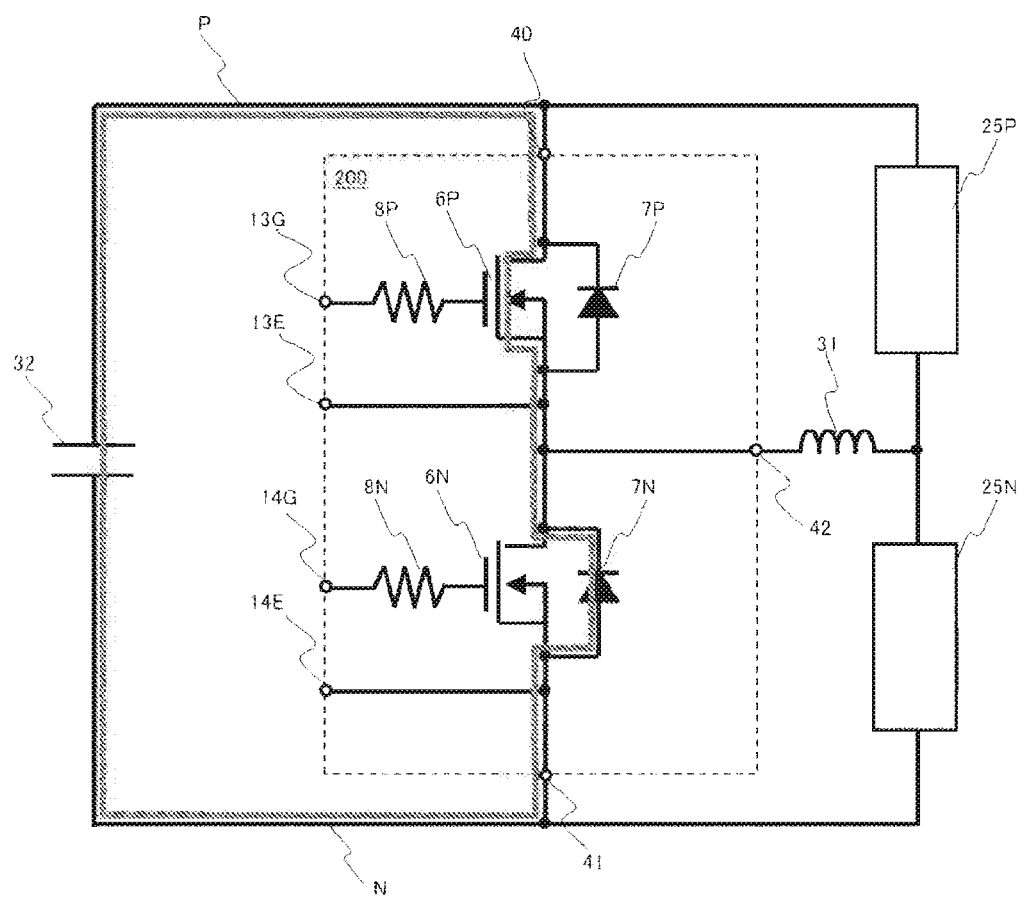
FIG. 11 is a circuit diagram showing a commutation loop during the switching operation of the positive arm-side self-arc-extinguishing type semiconductor element in the power semiconductor module according to the second embodiment of the present invention.

FIG. 10 is a switching operation circuit diagram of a positive arm-side self-arc-extinguishing type semiconductor element in a 2-level circuit according to the second embodiment of the present invention. FIG. 11 is a circuit diagram showing a commutation loop during the switching operation of the positive arm-side self-arc-extinguishing type semiconductor element in the power semiconductor module according to the second embodiment of the present invention. Referring to the operation circuit diagrams shown in FIGS. 10(a), 10(b) and 11, an explanation will be hereinafter given with regard to the mode in which positive arm-side MOSFET 6P is switched, for example, by exemplifying the case where self-arc-extinguishing type semiconductor element 6P is provided as a MOSFET. Also in FIGS. 10 and 11, a plurality of self-arc-extinguishing type semiconductor elements 6, a plurality of reflux diodes 7 and a plurality of gate resistances 8 in each arm are collectively shown.

As shown in FIG. 10(a), both ends of capacitor 32 are connected between a positive-side DC bus P and a negative-side DC bus N, in which positive electrode terminal 40 of power semiconductor module 200 is connected to positive-side DC bus P, and negative electrode terminal 41 of power semiconductor module 200 is connected to negative-side DC bus N, thereby forming a 2-level circuit. The portion surrounded by a dotted line in FIG. 10(a) shows power semiconductor module 200, and open circles show external terminals of positive electrode terminal 40, negative electrode terminal 41, and output terminal 42 that are exposed from the surface of power semiconductor module 200. Also in FIG. 10, each arrow overlaid on the circuit shows a current path in the case where positive arm-side MOSFET 6P is switched.

Figure 15:
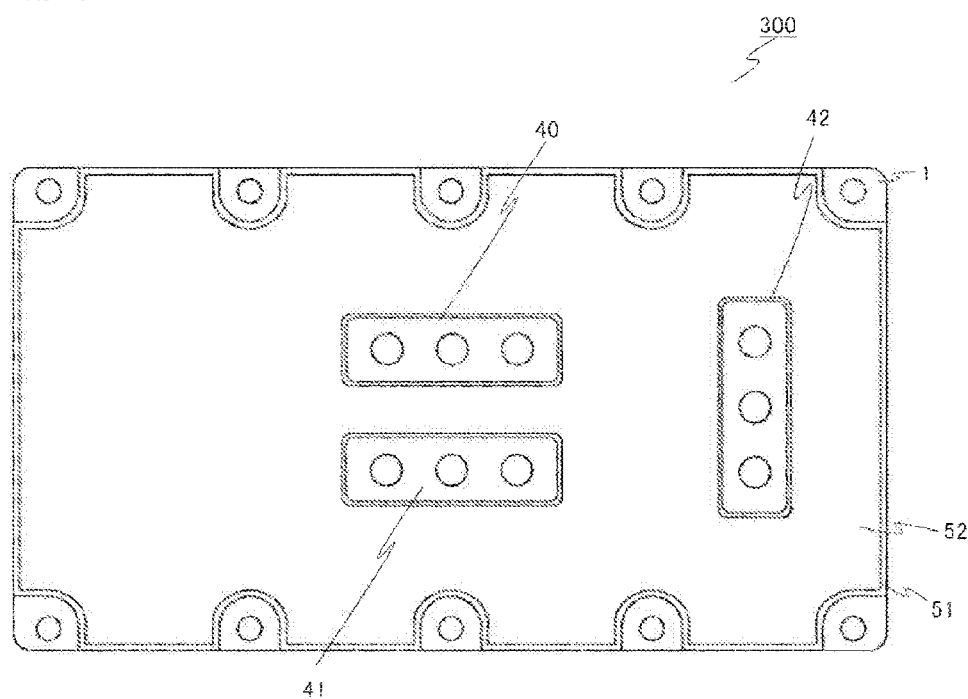
FIG. 15 is a top external view of the power semiconductor module according to the third embodiment of the present invention.

In FIG. 10(a), when positive arm-side MOSFET 6P is turned on, the current flows from the positive electrode of capacitor 32 through positive arm-side MOSFET 6P and output terminal 42, then passes via a load 31 such as a motor through a negative arm 25N in other phase, and then flows into the negative electrode of capacitor 32. Since the inductance component exerts an influence upon the load when the MOSFET is switched, load 31 is represented as an inductance in FIG. 10. On the other hand, when positive arm-side MOSFET 6P is switched from ON to OFF, the current flowing into load 31 flows back to a negative arm-side reflux diode 7N as shown in FIG. 10(b). Therefore, the commutation loop occurring at the time when positive arm-side MOSFET 6P is turned off is formed as a loop extending from the positive electrode of capacitor 32 through positive arm-side MOSFET 6P and negative arm-side reflux diode 7N back to the negative electrode of capacitor 32, as shown in FIG. 15. FIGS. 10(a), 10(b) and 11 each show only the MOSFET, the reflux diode and the capacitor, but the circuit actually includes an inductance and a resistance component of a wiring line that connects semiconductor elements to each other, and its commutation loop includes its wiring inductance and resistance component.

On the other hand, when negative arm-side MOSFET 6N is switched, the commutation loop is formed as a loop extending from the positive electrode of capacitor 32 through positive arm-side reflux diode 7P and negative arm-side MOSFET 6N back to the negative electrode of capacitor 32, in the same manner as described above. As described above, the surge voltage applied when self-arc-extinguishing type semiconductor element 6 is turned off is proportional to the inductance in the commutation loop. Accordingly, the inductance in the commutation loop shown in FIG. 11 needs to be reduced in the 2-level circuit. The factor of the inductance in the commutation loop is categorized into three factors including: an inductance of the bus bar connecting the capacitor to the power semiconductor module; an inductance of the capacitor itself; and an inductance within the power semiconductor module. The present invention relates to the third factor associated with reduction of a wiring inductance within the power semiconductor module.

Figure 12:
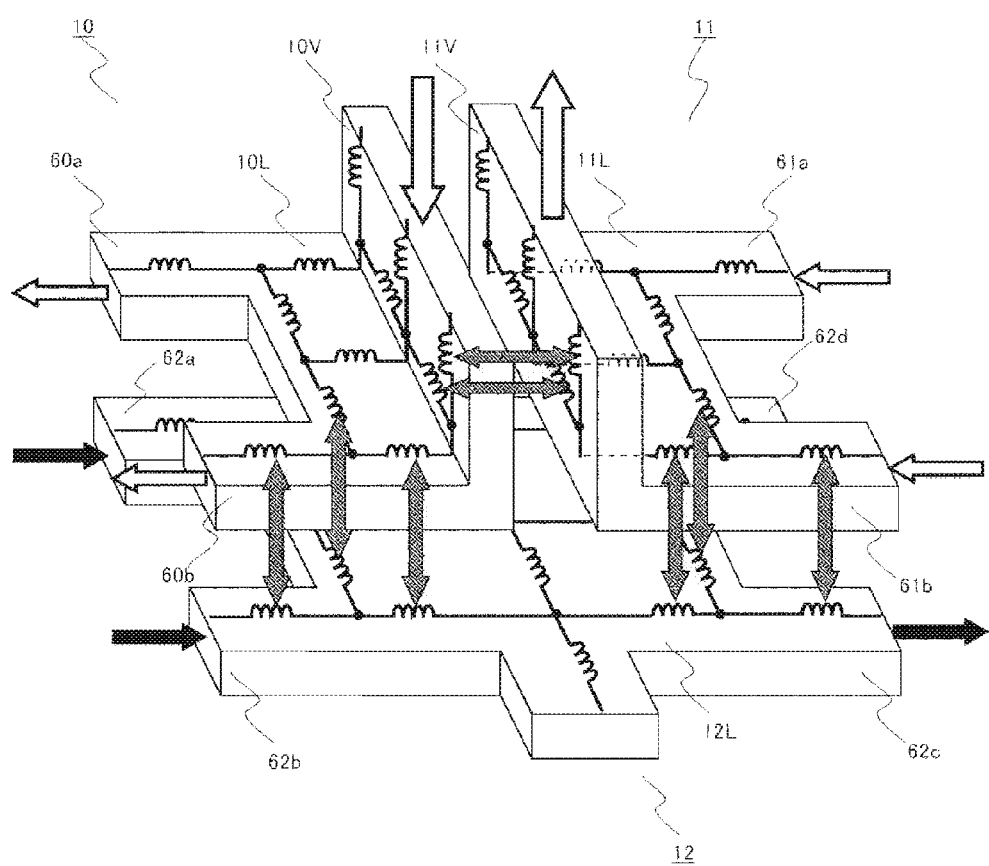
FIG. 12 is a schematic diagram showing the state of cancellation of a magnetic flux between electrodes facing each other during occurrence of the commutation loop shown in FIG. 11.

FIG. 12 is a schematic diagram showing the state of cancellation of a magnetic flux between the electrodes facing each other during occurrence of the commutation loop shown in FIG. 11. In FIG. 12, positive electrode 10 includes a parallel surface 10L provided as a parallel surface portion, a vertical surface 10V provided as a vertical surface portion, and positive branch electrodes 60a and 60b each serving as a branch electrode portion in positive electrode 10. Negative electrode 11 includes a parallel surface 11L provided as a parallel surface portion, a vertical surface 11V provided as a vertical surface portion, and negative branch electrodes 61a and 61b each serving as a branch electrode portion in negative electrode 11. AC electrode 12 includes a parallel surface 12L provided as a parallel surface portion, and AC branch electrodes 62a, 62b, 62c, and 62d each serving as a branch electrode portion in AC electrode 12. Also, each arrow schematically shows the direction in which a current flows, and each wiring line part is represented as an inductance. Furthermore, each double-headed arrow explicitly shows a portion of each wiring line part where magnetic flux cancellation occurs. The current path during occurrence of the commutation loop mentioned above will be described as follows.

FIG. 12 shows a part of the commutation loop shown in FIG. 11 that is located within the power semiconductor module, which is specifically as follows: positive electrode terminal 40 (not shown)→vertical surface 10V of positive electrode 10→parallel surface 10L of positive electrode 10→positive branch electrodes 60a and 60b→positive arm-side insulating substrate 101 (not shown)→AC branch electrodes 62a and 62b→parallel surface 12L of AC electrode 12→AC branch electrodes 62c and 62d→negative arm-side insulating substrate 111 (not shown)→negative branch electrodes 61a and 61b→parallel surface 11L of negative electrode 11→vertical surface 11V of negative electrode 11→negative electrode terminal 41 (not shown). In this process, (i) between vertical surface 10V of positive electrode 10 and vertical surface 11V of negative electrode 11, (ii) between parallel surface 10L of positive electrode 10 and parallel surface 12L of AC electrode 12, (iii) between positive branch electrodes 60a, 60b and AC branch electrodes 62a, 62b, (iv) between parallel surface 11L of negative electrode and parallel surface 12L of AC electrode, and (v) between negative branch electrodes 61a, 61b and AC branch electrodes 62c, 62d, the direction of di/dt is reversed and the magnetic flux is cancelled. Thus, the inductance can be reduced in each of facing portions of positive electrode 10, negative electrode 11 and AC electrode 12 that are arranged such that one electrode faces each of the other two electrodes.

In this case, vertical surface 10V of positive electrode 10 and vertical surface 11V of negative electrode 11 each have a surface that is relatively long in the longitudinal direction. Accordingly, in vertical surface 10V of positive electrode 10, the current flows so as to spread in the longitudinal direction. In vertical surface 11V of negative electrode 11, the current spreading in the longitudinal direction flows so as to gather into negative electrode terminal 41. Therefore, between vertical surface 10V of positive electrode 10 and vertical surface 11V of negative electrode 11, cancellation of the magnetic flux occurs in the entire vertical surfaces, so that the inductance can be reduced effectively.

Furthermore, the current similarly spreads in the longitudinal direction also between parallel surface 10L of positive electrode 10 and parallel surface 12L of AC electrode 12, and between parallel surface 11L of negative electrode 11 and parallel surface 12L of AC electrode 12. Accordingly, cancellation of magnetic flux occurs in the entire parallel surfaces, so that the inductance can be reduced effectively.

As described above, also in the case where power semiconductor module 200 includes a plurality of insulating substrates 2 as a positive arm and a negative arm, the inductance can be reduced in the loop extending from positive electrode terminal 10 through negative electrode terminal 11. Furthermore, the inductance can be reduced also when the current spreads in the longitudinal direction.

In the power semiconductor module configured as described above, positive electrode 10, negative electrode 11 and AC electrode 12 are arranged such that one electrode faces each of the other two electrodes. Accordingly, it becomes possible to cancel the magnetic flux generated between the electrodes at the time when a current flows through each electrode. Consequently, the inductance caused by each of positive electrode 10, negative electrode 11 and AC electrode 12 is reduced, and the surge voltage applied to the power semiconductor element is reduced, so that the reliability of the power semiconductor module can be improved.

Although an explanation has been given in the present embodiment with regard to the case where two insulating substrates 2 are arranged in each of the positive arm and the negative arm, the effect of the present invention can be achieved also in the case where two or more insulating substrates 2 are arranged in each of the arms. Also in the module structure in which a plurality of insulating substrates 2 are arranged in each of the arms, the commutation loop during switching of self-arc-extinguishing type semiconductor element 6 is the same as that in the case where two insulating substrates 2 are arranged in each arm except that the number of parallel arrangement of branch electrodes in the electrode is increased.

Third Embodiment

The third embodiment is different from the second embodiment in that positive electrode terminal 40 and negative electrode terminal 41 used in the second embodiment are arranged in the center portion of the power semiconductor module. By arranging the positive electrode terminal and the negative electrode terminal in the center portion of the power semiconductor module in this way, the path lengths of the current are equalized with respect to a plurality of insulating substrates 2 mounted in the power semiconductor module during occurrence of the commutation loop extending from positive electrode terminal 40 through negative electrode terminal 41, so that each of the wiring inductance and the wiring resistance can be equalized. Thereby, variations in the current flowing through wiring patterns 3 and 4 on each insulating substrate 2 can be suppressed, so that it becomes possible to suppress current variations in semiconductor elements such as a self-arc-extinguishing type semiconductor element and a reflux diode that are mounted in each insulating substrate 2. Furthermore, current variations are suppressed, thereby allowing suppression of temperature variations in the semiconductor element, so that the heat cycle life can be improved.

Figure 13:
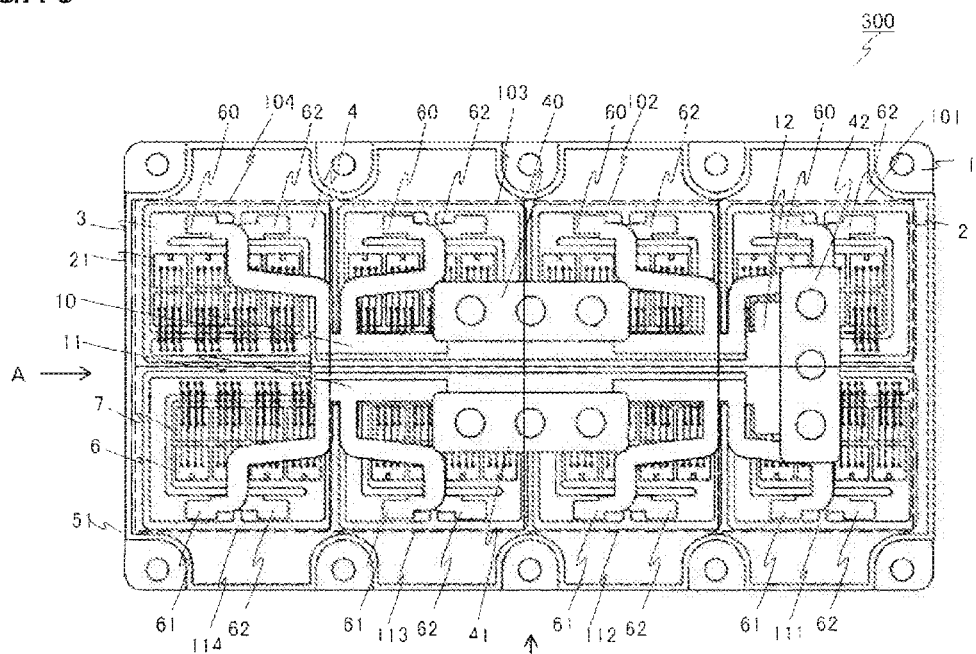
FIG. 13 is a top plan view and a schematic side view of a power semiconductor module according to the third embodiment of the present invention.
Figure 13:
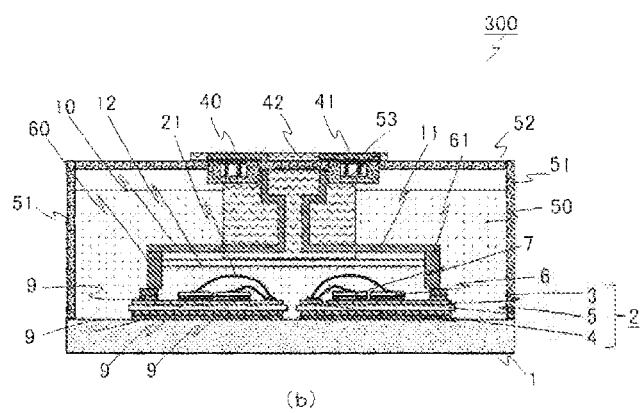
Figure 14:
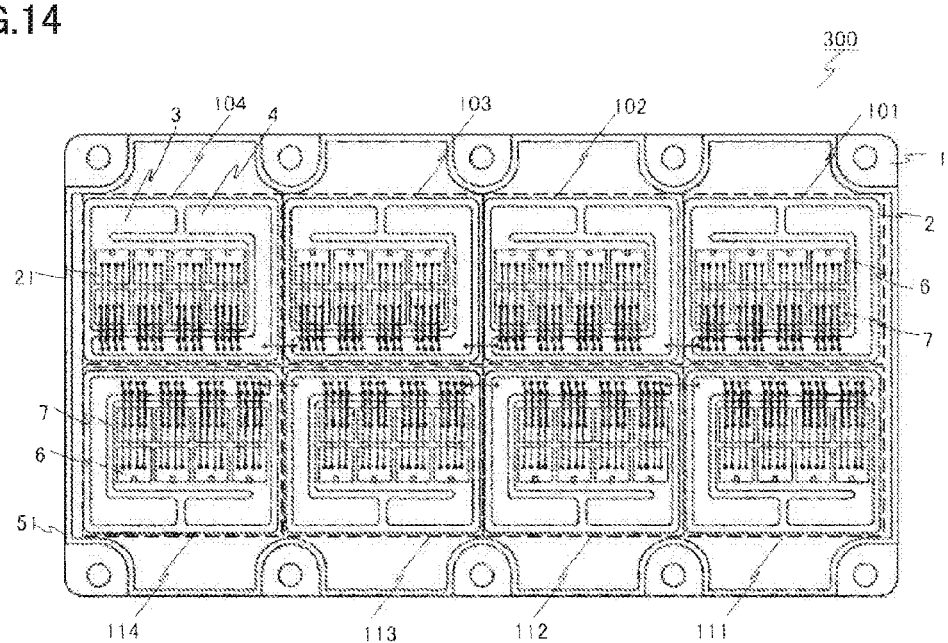
FIG. 14 is a top plan view of the power semiconductor module according to the third embodiment of the present invention, from which an electrode is removed.

FIG. 13 is a schematic top plan view and a schematic side view of a power semiconductor module according to the third embodiment of the present invention. FIG. 13(a) shows a schematic top plan view of a power semiconductor module 300. FIG. 13(b) shows a schematic side view as seen from the B side in FIG. 13(a). FIG. 13(c) shows a schematic side view as seen from the A side in FIG. 13(a). In these figures, the direction as seen from the B side is defined as a B direction while the direction as seen from the A side is defined as an A direction. FIG. 14 is a schematic top plan view of the power semiconductor module according to the third embodiment of the present invention, from which an electrode is removed. FIG. 15 is a top external view of the power semiconductor module according to the third embodiment of the present invention. Each of the positive arm and the negative arm includes four insulating substrates 2. Positive electrode terminal 40 and negative electrode terminal 41 are arranged near the center of the module. It is characterized in that AC terminal 42 is arranged at a portion where positive electrode terminal 40 and negative electrode terminal 41 are not arranged. Although the present embodiment provides an example in which four insulating substrates 2 are provided in each of the positive arm and the negative arm, the number of insulating substrates 2 is not particularly limited. In order to clearly explain the effect of the present invention, the present embodiment will be hereinafter described with reference to FIGS. 13 to 16.

In FIG. 13, a power semiconductor module 300 according to the third embodiment includes a base plate 1, an insulating substrate 2, a collector (drain) wiring pattern 3, an emitter (source) wiring pattern 4, a self-arc-extinguishing type semiconductor element 6, a reflux diode 7, a solder 9, a positive electrode 10 serving as a positive-side electrode, a negative electrode 11 serving as a negative-side electrode, an AC electrode 12, a bonding wire 21, a positive electrode terminal 40 serving as a terminal portion in positive electrode 10, a negative electrode terminal 41 serving as a terminal portion in negative electrode 11, an AC terminal 42 serving as a terminal portion in AC electrode 12, a positive branch electrode 60 serving as a branch electrode portion in positive electrode 10, a negative branch electrode 61 serving as a branch electrode portion in negative electrode 11, an AC branch electrode 62 serving as a branch electrode portion in AC electrode 12, a sealing material 50, a case 51, a cover 52, and a nut 53.

In FIG. 13, positive electrode terminal 40 and negative electrode terminal 41 are arranged near the center portion in power semiconductor module 300. Even in the case where the distances (electrode lengths) from positive electrode terminal 40 and negative electrode terminal 41 to wiring patterns 3 and 4 are not equal or not strictly equal due to the configuration of the electrode, positive branch electrode 60 and negative branch electrode 61 are configured such that each of the wiring inductance and the wiring resistance is equalized, and also, AC branch electrode 62 is formed identical to and to be parallel to positive branch electrode 60 and negative branch electrode 61. Furthermore, by adjusting the positions of wiring patterns 3 and 4 connected to each of positive branch electrode 60, negative branch electrode 61 and AC branch electrode 62, each of the wiring inductance and the wiring resistance can be equalized.

Also in the case where the distances (electrode lengths) from positive electrode terminal 40 and negative electrode terminal 41 to wiring patterns 3 and 4 are not equal or not strictly equal due to the configuration of the electrode, the branch electrode branched from both ends of the longer side of each electrode is formed in a V-shape extending from the longer side of the electrode as a starting point, so that the current path length can be equalized.

Figure 16:
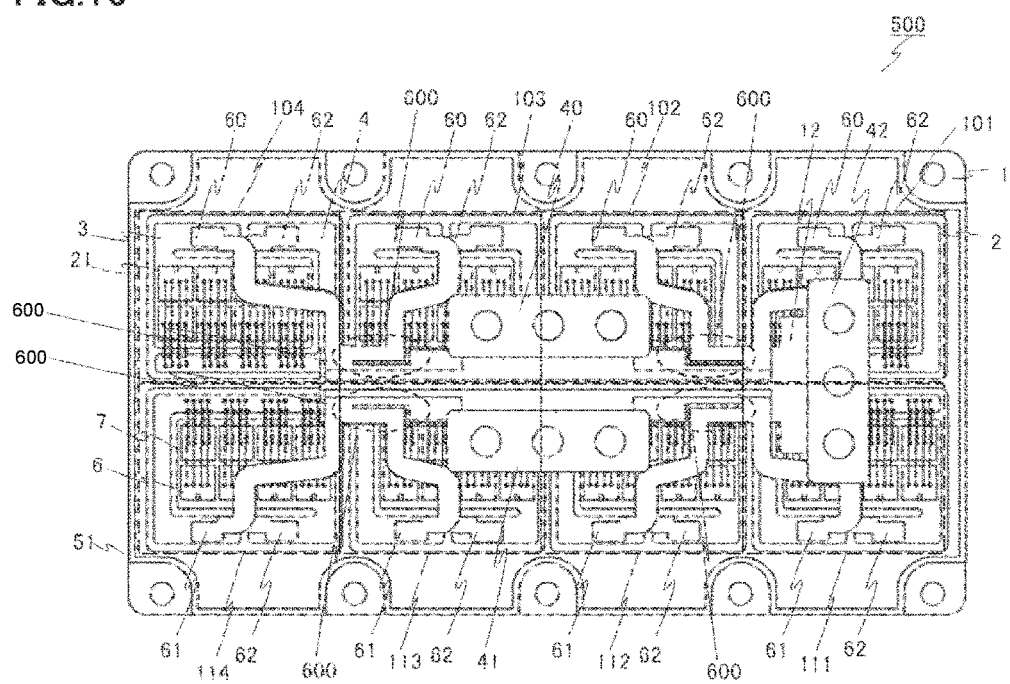
FIG. 16 is a schematic top plan view of the power semiconductor module according to the third embodiment of the present invention, which shows the case where a slit is provided in a branch electrode portion of the power semiconductor module.

FIG. 16 is a schematic top plan view of the power semiconductor module according to the third embodiment of the present invention, which shows the case where a slit is provided in a branch electrode portion of the power semiconductor module. In FIG. 16, positive electrode 10 and negative electrode 11 each are provided with a slit 600 as surrounded by a dotted line. In FIG. 13, the electrode is divided at the approximately same position into two sections. As shown in FIG. 16, however, even if the branching positions are different, each of the wiring inductance and the wiring resistance can be equalized by proving slit 600 in the parallel surface or the vertical surface of the electrode, even in the case where the distances (electrode lengths) from positive electrode terminal 40 and negative electrode terminal 41 to wiring patterns 3 and 4 are not equal or not strictly equal due to the configuration of the electrode. Furthermore, a slit having the same shape as those in positive electrode 10 and negative electrode 11 is provided also in the flat plane portion of AC electrode 12 that faces the flat plane portion in each of positive electrode 10 and negative electrode 11. Thereby, the path of the commutation loop extending through positive electrode 10 and AC electrode 12 overlaps with the path of the commutation loop extending through negative electrode 11 and AC electrode 12, so that the inductance can be more efficiently reduced. As described above, the slit can equalize each of the wiring inductance and the wiring resistance even in the case where the distances (electrode lengths) from positive electrode terminal 40 and negative electrode terminal 41 to wiring patterns 3 and 4 are not equal or not strictly equal due to the configuration of the electrode. In addition to this, positive electrode terminal 40 and negative electrode terminal 41 are arranged in the center portion of the power semiconductor module, thereby achieving an effect that the distances to the insulating substrates are more likely to be equalized, or each of the wiring inductance and the wiring resistance is more likely to be equalized.

In the power semiconductor module configured as described above, since positive electrode 10, negative electrode 11 and AC electrode 12 are arranged such that one electrode faces the other two electrodes, it becomes possible to cancel the magnetic flux generated between the electrodes at the time when a current flows through each electrode. Consequently, the inductance caused by each of positive electrode 10, negative electrode 11 and AC electrode 12 are reduced, and the surge voltage applied to the semiconductor element is reduced, so that the reliability of the power semiconductor module can be improved. It is to be noted that the present embodiment shows an example in which four insulating substrates 2 are included in each of the positive arm and the negative arm, but the number of insulating substrates 2 is not particularly limited. The same effect as that in the present invention can be achieved as long as the power semiconductor module has a positive arm and a negative arm each including two or more insulating substrates.

Fourth Embodiment

The fourth embodiment is different from the first to third embodiments in that a 2-in-1 type module is used to constitute a 3-level circuit. Even in the case where a 3-level circuit is configured in this way, positive electrode 10, negative electrode 11 and AC electrode 12 are arranged such that one electrode faces the other two electrodes, so that, during the operation of the 3-level circuit, the direction of di/dt is reversed and the magnetic flux is cancelled at facing portions of positive electrode 10, negative electrode 11, and AC electrode 12. Consequently, the inductance can be reduced at each of the facing portions of positive electrode 10, negative electrode 11, and AC electrode 12.

Figure 17:
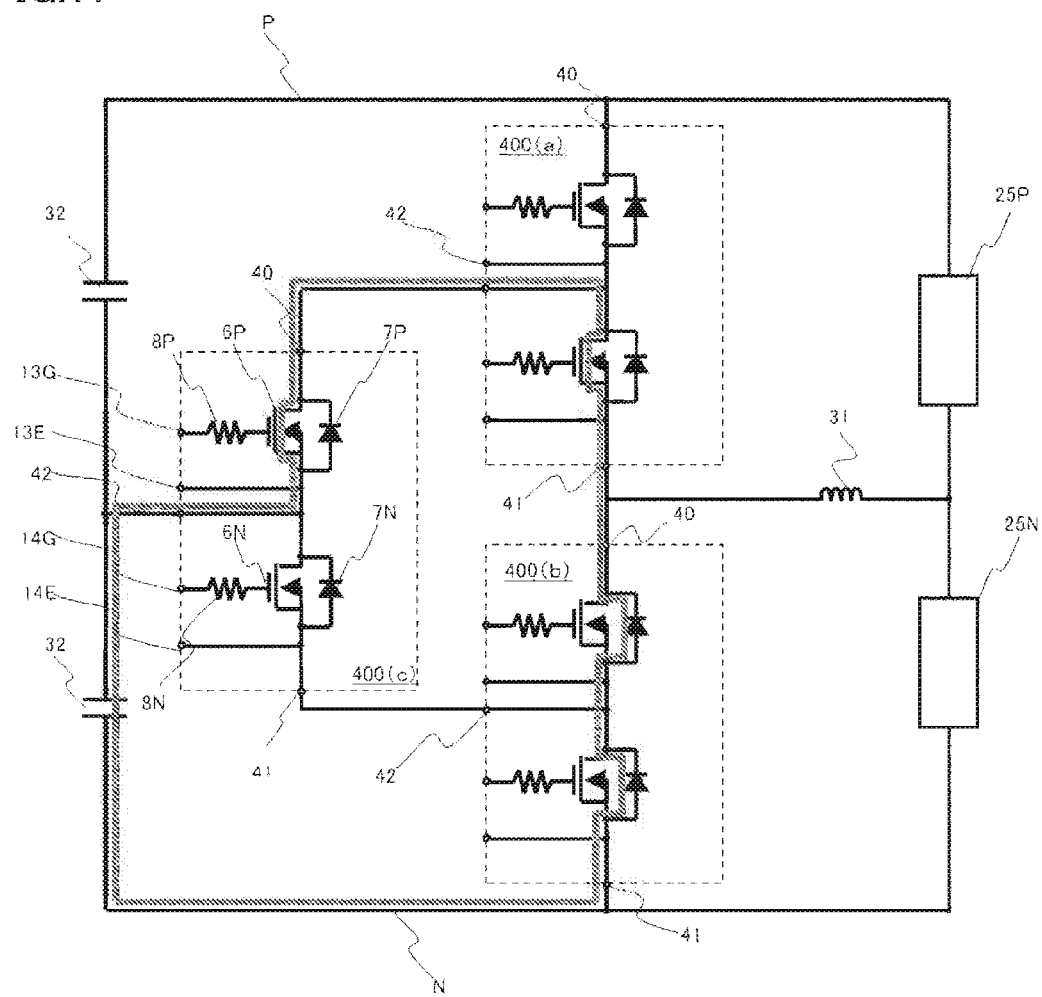
FIG. 17 is a circuit diagram showing a commutation loop during the switching operation of a self-arc-extinguishing type semiconductor element in a 3-level circuit of a power semiconductor module according to the fourth embodiment of the present invention.

FIG. 17 is a circuit diagram showing a commutation loop during the switching operation of the self-arc-extinguishing type semiconductor element in a 3-level circuit of the power semiconductor module according to the fourth embodiment of the present invention. FIG. 17 shows an example of a 3-level circuit. As a circuit configuration in FIG. 17, a 3-level circuit is configured using three power semiconductor modules 400 (400(a), 400(b), 400(c)). Such power semiconductor modules 400 (400(a), 400(b), 400(c)) may be any of power semiconductor modules 100, 200, and 300 in the first to third embodiments.

FIG. 17 shows a configuration that is formed using: power semiconductor module 400(a) connected to positive-side DC bus P; power semiconductor module 400(b) connected to negative-side DC bus N; and power semiconductor module 400(c) as a clamp diode. Other than using a diode as a clamp diode, MOSFETs arranged in parallel can also be used as synchronous rectification as shown in power semiconductor module 400(c) in FIG. 17. Examples that can be used as synchronous rectification are not limited to a MOSFET arranged in power semiconductor module 400(c), but can be a MOSFET arranged within power semiconductor module 400(a) and a MOSFET arranged within power semiconductor module 400(b).

FIG. 17 shows an example of the commutation loop during the operation of the 3-level circuit. The commutation loop shown in FIG. 17 occurs when positive arm MOSFET 6P in power semiconductor module 400(a) is switched off, and when negative arm MOSFET 6N in power semiconductor module 400(a) is switched from ON to OFF. Here, in the case where power semiconductor module 400 in the 3-level circuit shown in FIG. 17 is assumed to be power semiconductor module 100 in the first embodiment, this commutation loop extends from AC terminal 42 in power semiconductor module 100 disposed at the position of power semiconductor module 400(c) through positive arm MOSFET 6P and positive electrode terminal 40, and then, extends from AC terminal 42 in power semiconductor module 100 disposed at the position of power semiconductor module 400(a) through negative arm MOSFET 6N and negative electrode terminal 41, and then, extends from positive electrode terminal 40 in power semiconductor module 100 disposed at the position of power semiconductor module 400(b) through positive arm reflux diode 7P, negative arm reflux diode 7N, and negative electrode terminal 41.

Figure 18:
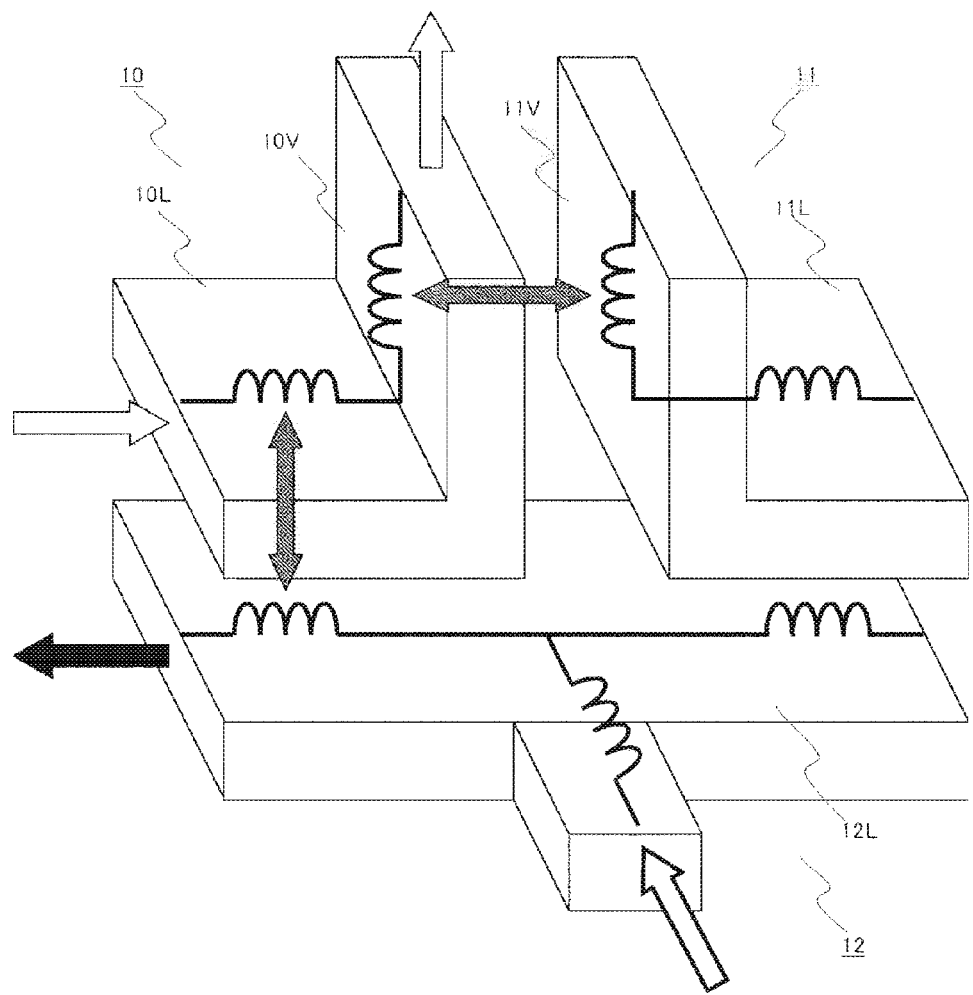
FIG. 18 is a schematic diagram showing the state of cancellation of a magnetic flux between electrodes facing each other in a power semiconductor module 400(c) during occurrence of the commutation loop shown in FIG. 17.

FIG. 18 is a schematic diagram showing the state of cancellation of a magnetic flux between the electrodes facing each other in power semiconductor module 400(c) during occurrence of the commutation loop shown in FIG. 17. FIG. 18 shows the case where power semiconductor module 400(c) is assumed to be power semiconductor module 100 in the first embodiment. In FIG. 8, positive electrode 10 includes a parallel surface 10L provided as a parallel surface portion, and a vertical surface 10V provided as a vertical surface portion; negative electrode 11 includes a parallel surface 11L provided as a parallel surface portion, and a vertical surface 11V provided as a vertical surface portion; and AC electrode 12 includes a parallel surface 12L provided as a parallel surface portion. Also, each arrow schematically shows the direction in which a current flows, and each wiring line part is represented as an inductance.

Furthermore, each double-headed arrow explicitly shows a portion of each wiring line part where magnetic flux cancellation occurs. The current path during occurrence of the commutation loop mentioned above will be described as follows.

FIG. 18 shows a part of the commutation loop shown in FIG. 17 that is located within the power semiconductor module, which is specifically as follows: AC terminal 42 (not shown)→parallel surface 12L of AC electrode 12→positive arm-side insulating substrate 101 (not shown)→parallel surface 10L of positive electrode 10→vertical surface 10V of positive electrode 10→positive electrode terminal 40 (not shown).

In this process, di/dt generated in vertical surface 10V of positive electrode 10 causes generation of an eddy current in vertical surface 11V of negative electrode 11, and then, the magnetic flux is cancelled between positive electrode 10 and negative electrode 11 that are arranged to face each other, so that the inductance can be reduced. Furthermore, the direction of di/dt is reversed and the magnetic flux is cancelled between parallel surface 10L of positive electrode 10 and parallel surface 12L of AC electrode 12, so that the inductance can be reduced between positive electrode 10 and AC electrode 12 that are arranged so as to face each other.

Figure 19:
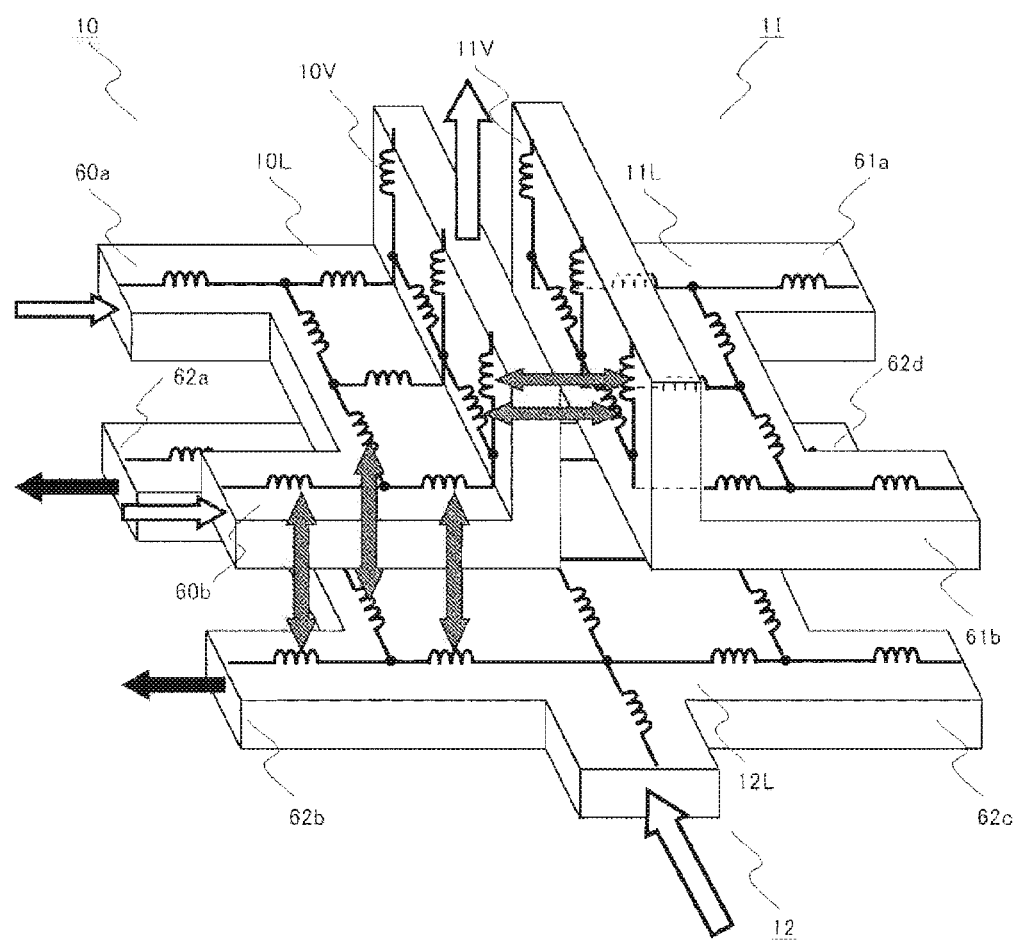
FIG. 19 is a schematic diagram showing the state of cancellation of a magnetic flux between electrodes facing each other in another power semiconductor module 400(c) during occurrence of the commutation loop shown in FIG. 17.

FIG. 19 is a schematic diagram showing the state of cancellation of a magnetic flux between the electrodes facing each other in another power semiconductor module 400(c) during occurrence of the commutation loop shown in FIG. 17. FIG. 19 shows the case where power semiconductor module 400(c) is assumed to be power semiconductor module 200 in the first embodiment. In FIG. 19, positive electrode 10 includes a parallel surface 10L provided as a parallel surface portion, a vertical surface 10V provided as a vertical surface portion, and positive branch electrodes 60a and 60b each serving as a branch electrode portion in positive electrode 10; negative electrode 11 includes a parallel surface 11L provided as a parallel surface portion, a vertical surface 11V provided as a vertical surface portion, and negative branch electrodes 61a and 61b each serving as a branch electrode portion in negative electrode 11; and AC electrode 12 includes a parallel surface 12L provided as a parallel surface portion, and AC branch electrodes 62a, 62b, 62c, and 62d each serving as a branch electrode portion in AC electrode 12. Also, each arrow schematically shows the direction in which a current flows, and each wiring line part is represented as an inductance. Furthermore, each double-headed arrow explicitly shows a portion of each wiring line part where magnetic flux cancellation occurs. The current path during occurrence of the commutation loop mentioned above will be described as follows.

FIG. 19 shows a part of the commutation loop shown in FIG. 17 that is located within the power semiconductor module, which is specifically as follows: AC terminal 42 (not shown)→parallel surface 12L of AC electrode 12→AC branch electrodes 62a and 62b→positive arm-side insulating substrate 101 (not shown)→positive branch electrodes 60a and 60b→parallel surface 10L of positive electrode 10→vertical surface 10V of positive electrode 10→positive electrode terminal 40 (not shown).

In this process, di/dt generated in vertical surface 10V of positive electrode 10 causes generation of an eddy current in vertical surface 11V of negative electrode 11, and then, the magnetic flux is cancelled between positive electrode 10 and negative electrode 11 that are arranged to face each other, so that the inductance can be reduced. Furthermore, the direction of di/dt is reversed and the magnetic flux is cancelled (i) between parallel surface 10L of positive electrode 10 and parallel surface 12L of AC electrode 12, and (ii) between positive branch electrodes 60a, 60b and AC branch electrodes 62a, 62b, respectively. Thereby, the inductance can be reduced between positive electrode 10 and AC electrode 12 that are arranged so as to face each other.

In this case, vertical surface 10V of positive electrode 10 and vertical surface 11V of negative electrode 11 each have a surface that is relatively long in the longitudinal direction. Accordingly, in vertical surface 10V of positive electrode 10, a current flows so as to spread in the longitudinal direction, which leads to generation of an eddy current in the entire vertical surface 11V of negative electrode 11, thereby leading to cancellation of the magnetic flux in the entire vertical surfaces of positive electrode 10 and negative electrode 11. Consequently, the inductance can be effectively reduced.

Furthermore, a current spreads in the longitudinal direction similarly also between parallel surface 10L of positive electrode 10 and parallel surface 12L of AC electrode 12. Accordingly, cancellation of the magnetic flux occurs in the entire parallel surfaces of positive electrode 10 and AC electrode 12, so that the inductance can be effectively reduced.

Figure 20:
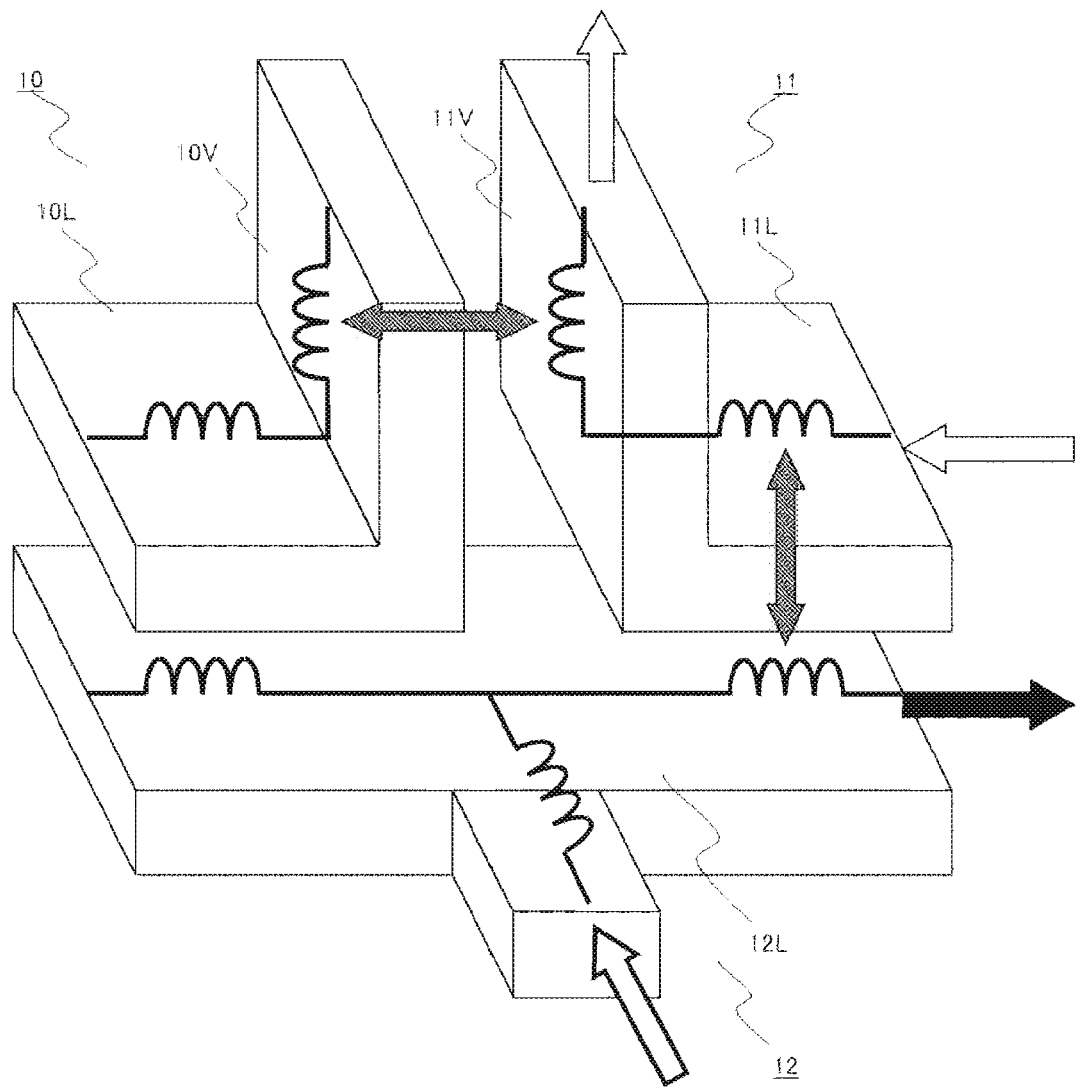
FIG. 20 is a schematic diagram showing the state of cancellation of a magnetic flux between electrodes facing each other in still another power semiconductor module 400(a) during occurrence of the commutation loop shown in FIG. 17.

FIG. 20 is a schematic diagram showing the state of cancellation of a magnetic flux between the electrodes facing each other in still another power semiconductor module 400(a) during occurrence of the commutation loop shown in FIG. 17. FIG. 20 shows the case where power semiconductor module 400(a) is assumed to be power semiconductor module 100 in the first embodiment. In FIG. 20, positive electrode 10 includes a parallel surface 10L provided as a parallel surface portion, and a vertical surface 10V provided as a vertical surface portion; negative electrode 11 includes a parallel surface 11L provided as a parallel surface portion, and a vertical surface 11V provided as a vertical surface portion; and AC electrode 12 includes a parallel surface 12L provided as a parallel surface portion. Also, each arrow schematically shows the direction of the temporal change of the current, and each wiring line part is represented as an inductance. Furthermore, each double-headed arrow explicitly shows a portion of each wiring line part where magnetic flux cancellation occurs. The current path during occurrence of the commutation loop mentioned above will be described as follows.

FIG. 20 shows a part of the commutation loop shown in FIG. 17 that is located within the power semiconductor module, which is specifically as follows: AC terminal 42 (not shown)→parallel surface 12L of AC electrode 12→negative arm-side insulating substrate 111 (not shown)→parallel surface 11L of negative electrode 11→vertical surface 11V of negative electrode 11→negative electrode terminal 41 (not shown).

In this process, di/dt generated in vertical surface 11V of negative electrode 11 causes generation of an eddy current in vertical surface 10V of positive electrode 10, and then, the magnetic flux is cancelled between positive electrode 10 and negative electrode 11 that are arranged to face each other, so that the inductance can be reduced. Furthermore, the direction of di/dt is reversed and the magnetic flux is cancelled between parallel surface 11L of negative electrode 11 and parallel surface 12L of AC electrode 12, so that the inductance can be reduced between negative electrode 11 and AC electrode 12 that are arranged so as to face each other.

Figure 21:
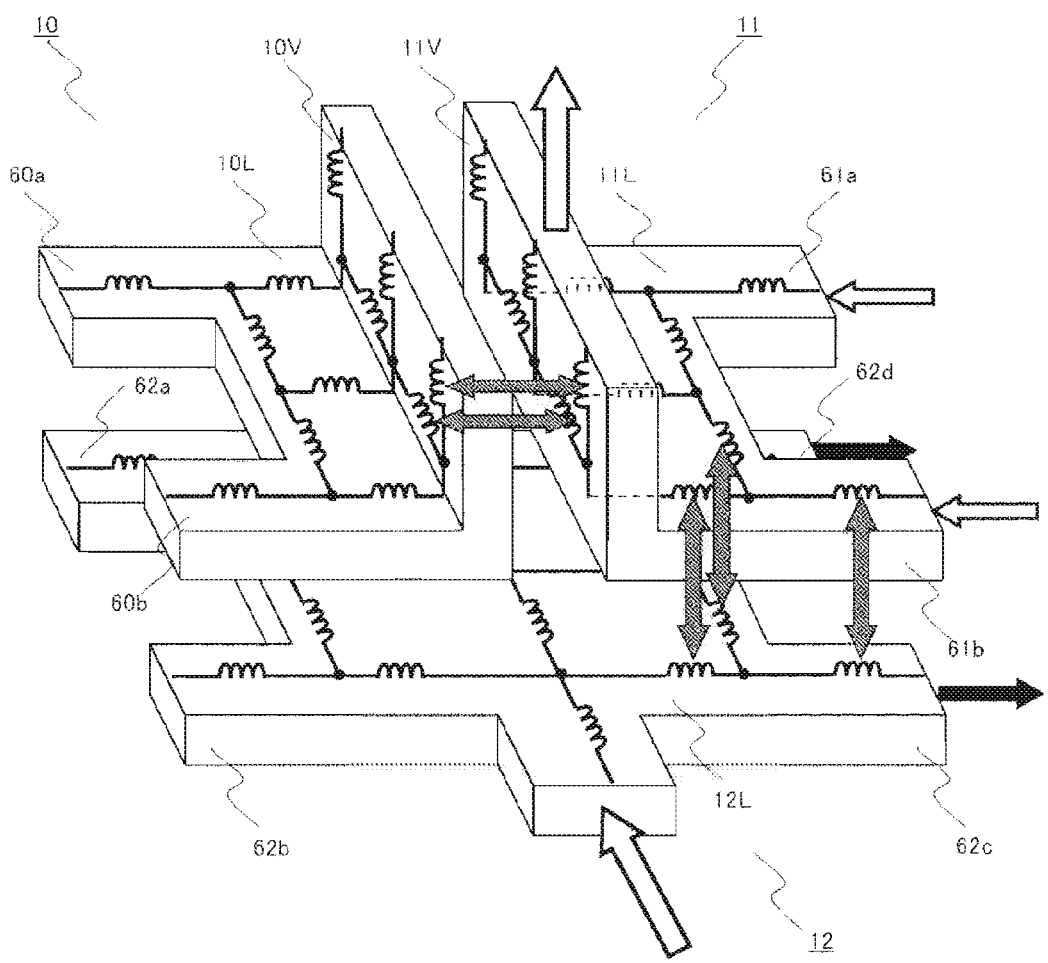
FIG. 21 is a schematic diagram showing the state of cancellation of a magnetic flux between electrodes facing each other in still another power semiconductor module 400(a) during occurrence of the commutation loop shown in FIG. 17.

FIG. 21 is a schematic diagram showing the state of cancellation of a magnetic flux between the electrodes facing each other in still another power semiconductor module 400(a) during occurrence of the commutation loop shown in FIG. 17. FIG. 21 shows the case where power semiconductor module 400(a) is assumed to be power semiconductor module 200 in the second embodiment. In FIG. 21, positive electrode 10 includes a parallel surface 10L provided as a parallel surface portion, a vertical surface 10V provided as a vertical surface portion, and positive branch electrodes 60a and 60b each serving as a branch electrode portion in positive electrode 10; negative electrode 11 includes a parallel surface 11L provided as a parallel surface portion, a vertical surface 11V provided as a vertical surface portion, and negative branch electrodes 61a and 61b each serving as a branch electrode portion in negative electrode 11; and AC electrode 12 includes a parallel surface 12L provided as a parallel surface portion, and AC branch electrodes 62a, 62b, 62c, and 62d each serving as a branch electrode portion in AC electrode 12. Also, each arrow schematically shows the direction in which a current flows, and each wiring line part is represented as an inductance. Furthermore, each double-headed arrow explicitly shows a portion of each wiring line part where magnetic flux cancellation occurs. The current path during occurrence of the commutation loop mentioned above will be described as follows.

FIG. 21 shows a part of the commutation loop shown in FIG. 17 that is located within the power semiconductor module, which is specifically as follows: AC terminal 42 (not shown)→parallel surface 12L of AC electrode 12→AC branch electrodes 62c and 62d→negative arm-side insulating substrate 111 (not shown)→negative branch electrodes 61a and 61b→parallel surface 11L of negative electrode 11→vertical surface 11V of negative electrode 11→negative electrode terminal 41 (not shown).

In this process, di/dt generated in vertical surface 11V of negative electrode 11 causes generation of an eddy current in vertical surface 10V of positive electrode 10, and then, the magnetic flux is cancelled between positive electrode 10 and negative electrode 11 that are arranged to face each other, so that the inductance can be reduced. Furthermore, the direction of di/dt is reversed and the magnetic flux is cancelled (i) between parallel surface 11L of negative electrode 11 and parallel surface 12L of AC electrode 12, and (ii) between negative branch electrodes 61a, 61b and AC branch electrodes 62c, 62d, respectively. Thereby, the inductance can be reduced between negative electrode 11 and AC electrode 12 that are arranged so as to face each other.

In this case, vertical surface 10V of positive electrode 10 and vertical surface 11V of negative electrode 11 each have a surface that is relatively long in the longitudinal direction. Accordingly, in vertical surface 11V of negative electrode 11, a current flows so as to spread in the longitudinal direction, which leads to generation of an eddy current in the entire vertical surface 10V in positive electrode 10. This further leads to cancellation of the magnetic flux in the entire vertical surfaces of positive electrode 10 and negative electrode 11, so that the inductance can be effectively reduced.

Furthermore, a current spreads in the longitudinal direction similarly also between parallel surface 11L of negative electrode 11 and parallel surface 12L of AC electrode 12. Accordingly, cancellation of the magnetic flux occurs in the entire parallel surfaces of negative electrode 11 and AC electrode 12, so that the inductance can be effectively reduced.

Furthermore, the inductance is reduced in the loop extending from positive electrode terminal 40 through AC terminal 42, and in the loop extending from negative electrode terminal 41 through AC terminal 42, thereby allowing suppression of variations in the current flowing through wiring patterns 3 and 4 in each insulating substrate 2. Thus, it becomes possible to suppress variations in the current flowing through the power semiconductor elements such as self-arc-extinguishing type semiconductor element 6 and reflux diode 7 that are mounted in each insulating substrate 2. Also, by suppressing variations in the current flowing through the power semiconductor element, the temperature variations in the power semiconductor element can be suppressed, so that the heat cycle life can be improved.

Also, in the case where power semiconductor module 100 according to the first embodiment is arranged at the position of power semiconductor module 400(b) during occurrence of the commutation loop as shown in FIG. 17, the effect similar to inductance reduction as described with reference to FIG. 7 in the first embodiment can be achieved. In the case where power semiconductor module 200 according to the second embodiment is arranged at the position of power semiconductor module 400(b), the effect similar to inductance reduction as described with reference to FIG. 12 in the second embodiment can be achieved. Although only the commutation loop shown in FIG. 17 has been described, it can be considered that the same also applies to the commutation loop occurring in the case where negative arm MOSFET 6N in power semiconductor module 400(b) is switched off, and the case where positive arm MOSFET 6P in power semiconductor module 400(b) is switched from ON to OFF. Accordingly, the effect of the present invention can be achieved.

When a 3-level circuit is configured in the fourth embodiment, there occur (i) a commutation loop extending through positive electrode terminal 40 and AC terminal 42, and (ii) a commutation loop extending through negative electrode terminal 41 and AC terminal 42, as having been described above. If the wiring inductance and the wiring resistance in the loop extending through positive electrode terminal 40 and AC terminal 42 are different from the wiring inductance and the wiring resistance, respectively, in the loop extending through negative electrode terminal 41 and AC terminal 42 during the circuit operation, current variations are more likely to occur between the case where the positive arm operates in power semiconductor module 400 and the case where the negative arm operates in power semiconductor module 400. The module as shown in each of power semiconductor modules 100, 200 and 300 in the first to third embodiments is configured such that particularly the distance between positive electrode terminal 40 and AC terminal 42 is set to be approximately equal to the distance between negative electrode terminal 41 and AC terminal 42. Thereby, it becomes possible to suppress variations in each of the wiring inductance and the wiring resistance between the loop extending through positive electrode terminal 40 and AC terminal 42 and the loop extending through negative electrode terminal 41 and AC terminal 42. Accordingly, it becomes possible to suppress variations in the current flowing through the power semiconductor element such as self-arc-extinguishing type semiconductor element 6 and reflux diode 7 that are mounted in each insulating substrate 2. Furthermore, by suppressing such current variations, the temperature variations in the semiconductor element can be suppressed, so that the heat cycle life can be improved.

In each of power semiconductor modules 100, 200 and 300, as AC terminal 42 is arranged closer to positive electrode terminal 40 and negative electrode terminal 41, the loop extending through positive electrode terminal 40 and AC terminal 42 and the loop extending through negative electrode terminal 41 and AC terminal 42 are more reduced in size, with the result that the wiring inductance and the wiring resistance can be reduced. This effect can be furthermore achieved, for example, when AC terminal 42 is arranged in the vicinity of positive electrode terminal 40 and negative electrode terminal 41 as shown in power semiconductor module 100 in the first embodiment. However, these terminals need to be arranged in the state where each insulation distance between these terminals is ensured.

In power semiconductor modules 100, 200 and 300 configured as described above, positive electrode 10, negative electrode 11 and AC electrode 12 are arranged such that one electrode faces the other two electrodes, and also, AC terminal 42 is arranged so as to be located close to positive electrode terminal 40 and negative electrode terminal 41. Accordingly, even when any type of commutation loop is generated, it becomes possible to cancel a magnetic flux generated between the electrodes at the time when a current flows through each electrode. Consequently, the inductance caused by each of positive electrode 10, negative electrode 11 and AC electrode 12 is reduced, and the surge voltage applied to the semiconductor element is decreased, so that the reliability of the power semiconductor module can be improved.

Also in the case where a current flows only through one of the electrodes facing each other, an eddy current is generated in the other electrode, and then, the magnetic flux is cancelled, so that the inductance can be reduced between the electrodes.

Furthermore, as in the third embodiment, in the case where positive electrode terminal 40 and negative electrode terminal 41 are arranged near the center portion of the module, and the case where the distances (electrode lengths) from positive electrode terminal 40 and negative electrode terminal 41 to wiring patterns 3 and 4 are not equal or not strictly equal due to the configuration of the electrode, positive branch electrode 60 and negative branch electrode 61 are configured such that each of the wiring inductance and the wiring resistance is equalized; and AC branch electrode 62 is formed identical to and arranged in parallel to positive branch electrode 60 and negative branch electrode 61. Accordingly, during occurrence of the commutation loop extending from positive electrode terminal 40 through negative electrode terminal 41 also in the 3-level circuit configuration diagram, the path lengths are equalized with respect to a plurality of insulating substrates mounted in the module, and each of the wiring inductance and the wiring resistance can be equalized. Accordingly, it becomes possible to suppress variations in the current flowing into the wiring pattern on each insulating substrate, so that it becomes possible to suppress variations in the current flowing through semiconductor elements such as a self-arc-extinguishing type semiconductor element and a reflux diode that are mounted in each insulating substrate. By suppressing the current variations, temperature variations in each semiconductor element are also suppressed, so that the effect of improving the heat cycle life is also achieved.

In addition, the effect in the fourth embodiment can be achieved even if the module including only a clamp diode not equipped with a MOSFET is used as power semiconductor module 400(*c*) in FIG. 17. Furthermore, in the case where a MOSFET is mounted within the power semiconductor module, the effect in the fourth embodiment can be achieved even if the MOSFET subjected to synchronous rectification is used. Furthermore, the same effect can be achieved in the portion illustrated as a MOSFET in FIG. 17 even if it is other type of self-arc-extinguishing type semiconductor element such as an IGBT and a bipolar transistor.

REFERENCE SIGNS LIST

1 base plate, 2 insulating substrate, 3, 4 wiring pattern, 5 ceramic insulating substrate, 6, 6P, 6N self-arc-extinguishing type semiconductor element, 7, 7P, 7N reflux diode, 8, 8P, 8N gate resistance, 9 solder, 10 positive electrode, 11 negative electrode, 12 AC electrode, 13E, 13G positive arm-side control terminal, 14E, 14G negative arm-side control terminal, 21 bonding wire, 22 wire bond for control, 25P positive arm in other phase, 25N negative arm in other phase, 31 load, 32 capacitor, 40 positive electrode terminal, 41 negative electrode terminal, 42 AC terminal, 50 sealing material, 51 case, 52 cover, 53 nut, 60 positive branch electrode, 61 negative branch electrode, 62 AC branch electrode, 100, 200, 300, 400(*a*), 400(*b*), 400(*c*), 500 power semiconductor module, 101, 102, 103, 104 positive arm-side insulating substrate, 111, 112, 113, 114 negative arm-side insulating substrate, 600 slit.

The invention claimed is:

1. A power semiconductor module comprising:
    positive/negative arms as a positive arm and a negative arm that are formed by series connection of self-arc-extinguishing type semiconductor elements, the positive arm and the negative arm being connected at a series connection point between the self-arc-extinguishing type semiconductor elements;
    a positive-side electrode, a negative-side electrode, and an AC electrode that are connected to the positive arm and the negative arm; and
    a substrate on which a wiring pattern is formed, the wiring pattern connecting the self-arc-extinguishing type semiconductor elements of the positive arm and the negative arm to the positive-side electrode, the negative-side electrode and the AC electrode,
    each of the positive-side electrode, the negative-side electrode, and the AC electrode including a parallel surface portion arranged to be parallel to a surface of the substrate on which the wiring pattern is formed,
    the substrate and the parallel surface portion of each of the positive-side electrode, the negative-side electrode and the AC electrode being insulated from each other with a sealing material interposed therebetween, and
    the positive-side electrode, the negative-side electrode, and the AC electrode arranged such that two of the positive-side electrode, the negative-side electrode and the AC electrode face each other at a distance from each other.

2. The power semiconductor module according to claim 1, wherein
    each of the positive-side electrode and the negative-side electrode includes a vertical surface portion arranged to be vertical to the surface of the substrate on which the wiring pattern is formed,
    the vertical surface portion of the positive-side electrode is arranged to face and to be parallel to the vertical surface portion of the negative-side electrode, and
    the parallel surface portion of the AC electrode is arranged to face and to be parallel to the parallel surface portion of the positive-side electrode and the parallel surface portion of the negative-side electrode.

3. The power semiconductor module according to claim 1, wherein
    each of the positive-side electrode, the negative-side electrode, and the AC electrode includes: a terminal portion connected to an external circuit; and a plurality of branch electrode portions each connected to the wiring pattern and branched from the parallel surface portion, each of the branch electrode portions has a flat plane portion that is coplanar to the parallel surface portion, the substrate is insulated from the parallel surface portion of each of the branch electrode portions, the parallel surface portion of each of the branch electrode portions is arranged on the substrate, the branch electrode portion of the positive-side electrode and the branch electrode portion of the AC electrode are insulated from each other, are at least partially identical in shape, and are arranged to face each other, and the branch electrode portion of the negative-side electrode and the branch electrode portion of the AC electrode are insulated from each other, are at least partially identical in shape, and are arranged to face each other.

4. The power semiconductor module according to claim 3, wherein a plurality of the substrates are provided, a plurality of the branch electrode portions are provided corresponding to the plurality of substrates, and a distance from the terminal portion of the positive-side electrode through the branch electrode portion of the positive-side electrode to the wiring pattern is equal to a distance from the terminal portion of the negative-side electrode through the branch electrode portion of the negative-side electrode to the wiring pattern.

5. The power semiconductor module according to claim 3, wherein each of the plurality of the branch electrode portions included in each of the positive-side electrode, the negative-side electrode and the AC electrode is formed in a V-shape extending as a starting point from a longer side of a corresponding one of the positive-side electrode, the negative-side electrode and the AC electrode.

6. The power semiconductor module according to claim 3, wherein the parallel surface portion is formed in a rectangular shape that has a long side portion on which the branch electrode portion is arranged.

7. The power semiconductor module according to claim 3, wherein the terminal portion of the AC electrode is arranged such that one side of the terminal portion of the AC electrode faces each of the terminal portion of the positive-side electrode and the terminal portion of the negative-side electrode.

8. The power semiconductor module according to claim 7, wherein each of the positive-side electrode and the negative-side electrode is provided with a slit, a distance from the terminal portion of the positive-side electrode to the wiring pattern and a distance from the terminal portion of the negative-side electrode to the wiring pattern are equal, and the wiring patterns are connected in parallel.

9. The power semiconductor module according to claim 8, wherein a distance between the terminal portion of the positive-side electrode and the terminal portion of the AC electrode is equal to a distance between the terminal portion of the negative-side electrode and the terminal portion of the AC electrode.

10. The power semiconductor module according to claim 7, wherein the terminal portion of the AC electrode is arranged to extend between the positive arm and the negative arm.

11. The power semiconductor module according to claim 3, wherein the power semiconductor module has an outer shape having a rectangular plane, and the terminal portion of the positive-side electrode and the terminal portion of the negative-side electrode are arranged in a center portion in the rectangular plane.

12. The power semiconductor module according to claim 1, wherein a plurality of the substrates are provided as the positive arm and the negative arm.

13. The power semiconductor module according to claim 1, further comprising a diode bonded to the wiring pattern so as to be connected in anti-parallel to the self-arc-extinguishing type semiconductor element, wherein the positive arm and the negative arm are formed by series connection of parallel circuits each formed of the self-arc-extinguishing type semiconductor element and the diode.

14. The power semiconductor module according to claim 13, wherein the diode is formed of a wide gap semiconductor that is wider in band gap than silicon.

15. The power semiconductor module according to claim 14, wherein the wide gap semiconductor is one of silicon carbide, a gallium nitride material, and a diamond.

16. The power semiconductor module according to claim 1, wherein the self-arc-extinguishing type semiconductor element is formed of a wide gap semiconductor that is wider in band gap than silicon.

17. A power semiconductor module comprising:

positive/negative arms as a positive arm and a negative arm that are formed by series connection of self-arc-extinguishing type semiconductor elements, the positive arm and the negative arm being connected at a series connection point between the self-arc-extinguishing type semiconductor elements;

a positive-side electrode, a negative-side electrode, and an AC electrode that are connected to the positive arm and the negative arm;

a substrate on which a wiring pattern is formed, the wiring pattern connecting the self-arc-extinguishing type semiconductor elements of the positive arm and the negative arm to the positive-side electrode, the negative-side electrode and the AC electrode; and a terminal portion included in each of the positive-side electrode, the negative-side electrode and the AC electrode, the terminal portion being connected to an external circuit, the power semiconductor module having an outer shape having a rectangular plane, and the terminal portion of the positive-side electrode and the terminal portion of the negative-side electrode being arranged in a center portion in the rectangular plane.

* * * * *